US012660193B2

(12) United States Patent
Kim et al.

(10) Patent No.: US 12,660,193 B2
(45) Date of Patent: Jun. 16, 2026

(54) SEMICONDUCTOR DEVICE INCLUDING STACK REGION AND PAD REGION HAVING DIFFERENT THICKNESS

(71) Applicant: Samsung Electronics Co., Ltd., Suwon-si (KR)

(72) Inventors: Sang-Lok Kim, Seoul (KR); Sang Soo Park, Hwaseong-si (KR); Jung-June Park, Seoul (KR); Su Chang Jeon, Seoul (KR); Sung-Min Joe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 721 days.

(21) Appl. No.: 17/985,328

(22) Filed: Nov. 11, 2022

(65) Prior Publication Data

US 2023/0240076 A1    Jul. 27, 2023

(30) Foreign Application Priority Data

Jan. 26, 2022    (KR) ........................ 10-2022-0011818

(51) Int. Cl.
| | |
|---|---|
| *H10B 43/40* | (2023.01) |
| *H10B 43/27* | (2023.01) |
| *H10B 43/35* | (2023.01) |
| *H10W 90/00* | (2026.01) |

(52) U.S. Cl.
CPC ............. *H10B 43/40* (2023.02); *H10B 43/27* (2023.02); *H10B 43/35* (2023.02); *H10W 90/00* (2026.01)

(58) Field of Classification Search
CPC ........ H10B 43/40; H10B 43/35; H10B 43/50; H01L 25/0655; H01L 25/105; H01L 2225/06506; H01L 2225/0651; H01L 2225/06524; H01L 2225/06555; H01L 2225/06562; H01L 2225/1052;
(Continued)

(56) References Cited

U.S. PATENT DOCUMENTS

| | | | |
|---|---|---|---|
| 8,981,574 B2 | 3/2015 | Kim et al. |
| 9,159,705 B2 | 10/2015 | Jang et al. |
| 10,679,952 B2 | 6/2020 | Paek et al. |

(Continued)

FOREIGN PATENT DOCUMENTS

| | | |
|---|---|---|
| KR | 20200037444 A | 4/2020 |
| KR | 20200076778 A | 6/2020 |

(Continued)

*Primary Examiner* — Thanh Y. Tran
(74) *Attorney, Agent, or Firm* — Muir Patent Law, PLLC

(57) ABSTRACT

Disclosed are semiconductor devices and semiconductor packages. The semiconductor device comprises a semiconductor substrate that includes a stack region and a pad region, a peripheral circuit structure that includes a plurality of peripheral circuits on the semiconductor substrate, a cell array structure on the peripheral circuit structure, and a redistribution layer on the cell array structure and including a redistribution dielectric layer and a redistribution pattern on the redistribution dielectric layer. The redistribution dielectric layer covers an uppermost conductive pattern of the cell array structure. The redistribution pattern is connected to the uppermost conductive pattern. A thickness in a vertical direction of the redistribution layer on the pad region is greater than that of the redistribution layer on the stack region.

20 Claims, 25 Drawing Sheets

(58) Field of Classification Search
CPC ......... H01L 25/18; H01L 25/50; H01L 24/08;
H01L 25/0657
See application file for complete search history.

(56) References Cited

U.S. PATENT DOCUMENTS

| | | |
|---|---|---|
| 2004/0051119 A1 | 3/2004 | Kikuma et al. |
| 2016/0118399 A1 | 4/2016 | Son et al. |
| 2019/0131277 A1 | 5/2019 | Yang et al. |
| 2020/0127009 A1 | 4/2020 | Song et al. |
| 2020/0381399 A1 | 12/2020 | Choi |
| 2020/0411484 A1 | 12/2020 | Jang et al. |
| 2021/0098381 A1 | 4/2021 | Yu et al. |
| 2021/0272929 A1 | 9/2021 | Tsai et al. |
| 2022/0157382 A1* | 5/2022 | Ahn ...................... G11C 16/10 |

FOREIGN PATENT DOCUMENTS

| | | |
|---|---|---|
| KR | 1020200134095 A | 12/2020 |
| KR | 20210025032 A | 3/2021 |

* cited by examiner

FIG. 18B 220
200
ML3
69
ML2
67
ML1
61/63/65
PLG3

OP

210

R2

R1

PERI

CA

CS

PS

10

SEMICONDUCTOR DEVICE INCLUDING STACK REGION AND PAD REGION HAVING DIFFERENT THICKNESS

CROSS-REFERENCE TO RELATED APPLICATION

This U.S. nonprovisional application claims priority under 35 U.S.C § 119 to Korean Patent Application No. 10-2022-0011818 filed on Jan. 26, 2022 in the Korean Intellectual Property Office, the disclosure of which is hereby incorporated by reference in its entirety.

BACKGROUND

The present disclosure relates to a semiconductor device and a semiconductor package including the same.

It is important to have a semiconductor device capable of storing a large amount of data in an electronic system which requires data storage. Therefore, studies have been conducted to increase data storage capacity of semiconductor devices. For example, as an approach to increase data storage capacity of a semiconductor device, a semiconductor device is suggested to include three-dimensionally arranged memory cells instead of two-dimensionally arranged memory cells.

SUMMARY

Some embodiments of the present disclosure provide a semiconductor device with improved reliability and increased integration.

Some embodiments of the present disclosure provide a semiconductor package capable of mounting a plurality of semiconductor chips while reducing a size.

The objectives of the present disclosure are not limited to those mentioned above, and other objects which have not been mentioned above will be clearly understood to those skilled in the art from the following description.

According to some embodiments of the present inventive concepts, a semiconductor device may comprise: a semiconductor substrate that includes a stack region and a pad region; a peripheral circuit structure that includes a plurality of peripheral circuits on the semiconductor substrate; a cell array structure on the peripheral circuit structure; and a redistribution layer on the cell array structure, the redistribution layer including a redistribution dielectric layer and a redistribution pattern on the redistribution dielectric layer, the redistribution dielectric layer covering an uppermost conductive pattern of the cell array structure, and the redistribution pattern being connected to the uppermost conductive pattern. A thickness in a vertical direction of the redistribution layer on the pad region may be greater than a thickness in the vertical direction of the redistribution layer on the stack region.

According to some embodiments of the present inventive concepts, a semiconductor package may comprise: a package substrate that includes a bonding pad at a top surface of the package substrate; and a plurality of semiconductor chips stacked on the package substrate. Each of semiconductor chips may include a stack region on which the semiconductor chip has a first thickness and a pad region on which the semiconductor chip has a second thickness greater than the first thickness. The pad regions of the semiconductor chips may be vertically and horizontally spaced apart from each other.

According to some embodiments of the present inventive concepts, a semiconductor package may comprise: a package substrate that includes a plurality of bonding pads at a top surface of the package substrate; a plurality of semiconductor chips stacked on the package substrate, each of the semiconductor chips including a stack region on which the semiconductor chip has a first thickness and a pad region on which the semiconductor chip has a second thickness greater than the first thickness; a plurality of bonding wires that connect the semiconductor chips to the bonding pads; and a molding layer on the package substrate and covering the semiconductor chips and the bonding wires. Each of the semiconductor chips may include: a semiconductor substrate; a peripheral circuit structure that includes a plurality of peripheral circuits on the semiconductor substrate; a cell array structure on the peripheral circuit structure; and a redistribution layer on the cell array structure, the redistribution layer including a redistribution dielectric layer and a redistribution pattern on the redistribution dielectric layer. The redistribution dielectric layer may cover an uppermost conductive pattern of the cell array structure. The redistribution pattern may be connected to the uppermost conductive pattern. The pad regions of the semiconductor chips may be vertically and horizontally spaced apart from each other.

According to some embodiments of the present inventive concepts, a method of fabricating a semiconductor package may comprise: providing a semiconductor substrate that includes a stack region and a pad region; forming on the semiconductor substrate a peripheral circuit structure that includes a plurality of peripheral circuits; forming a stack structure that includes a plurality of electrodes vertically stacked on the peripheral circuit structure on the stack region; forming a plurality of vertical structures that penetrate the stack structure; forming a planarized dielectric layer that covers the stack structure on the peripheral circuit structure; forming a plurality of interlayer dielectric layers and a plurality of conductive patterns on the stack structure and the planarized dielectric layer; and forming a redistribution layer on an uppermost one of the interlayer dielectric layers. A vertical thickness of the redistribution layer on the pad region may be greater than a vertical thickness of the redistribution layer on the stack region.

Details of other embodiments are included in the description and drawings.

BRIEF DESCRIPTION OF THE DRAWINGS

FIGS. 8A and 8B illustrate simplified cross-sectional views showing a semiconductor chip according to some embodiments of the present inventive concepts.

FIGS. 15A, 15B, and 15C illustrate cross-sectional views showing a method of fabricating a semiconductor device according to some embodiments of the present inventive concepts.

FIGS. 16A, 16B, and 16C illustrate cross-sectional views showing a method of fabricating a semiconductor device according to some embodiments of the present inventive concepts.

FIGS. 17A, 17B, and 17C illustrate cross-sectional views showing a method of fabricating a semiconductor device according to some embodiments of the present inventive concepts.

FIGS. 18A and 18B illustrate cross-sectional views showing a method of fabricating a semiconductor device according to some embodiments of the present inventive concepts.

DETAIL DESCRIPTION OF EMBODIMENTS

The following will now describe some embodiments of the present inventive concepts in conjunction with the accompanying drawings.

Figure 1:
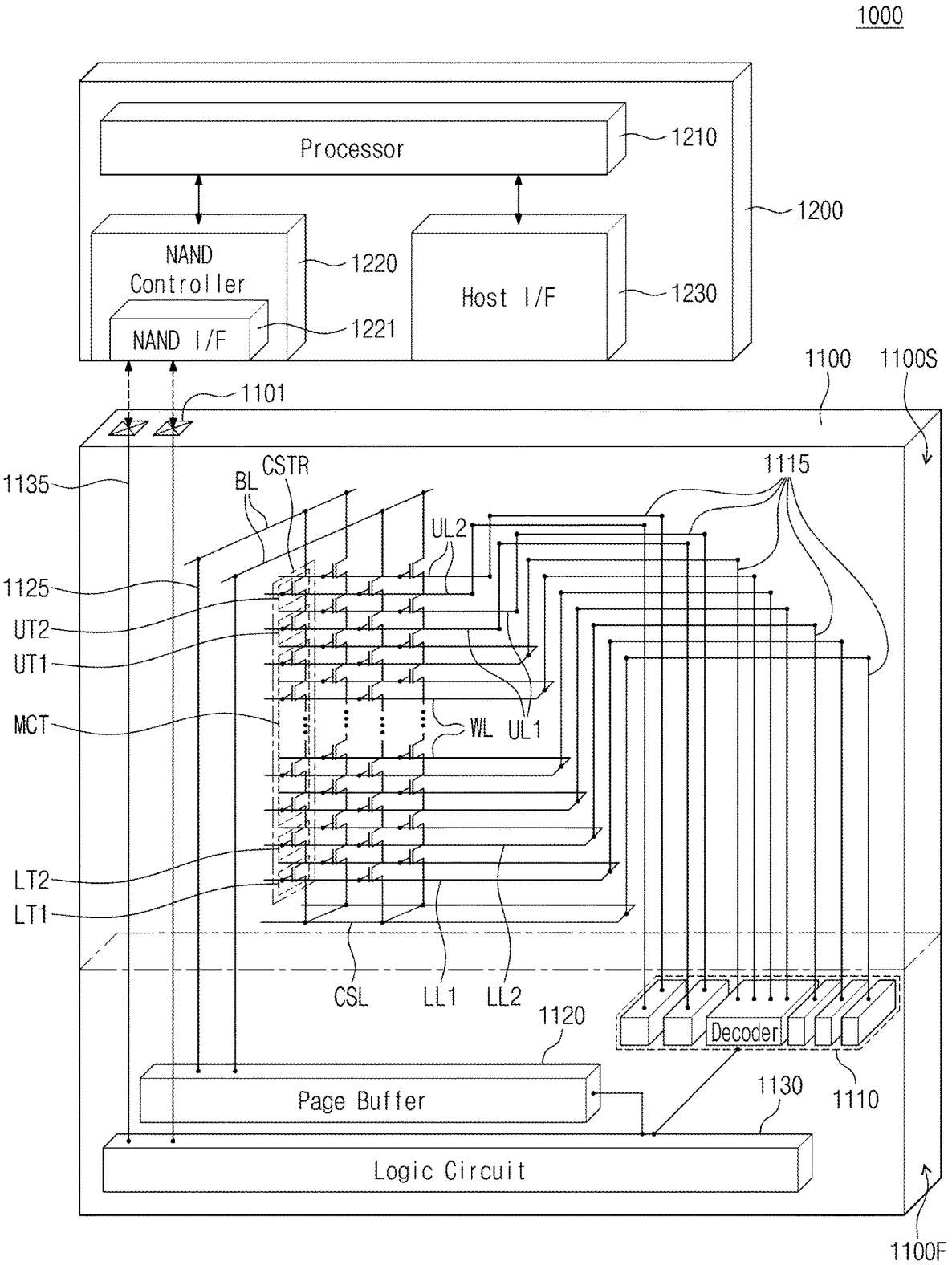
FIG. 1 illustrates a simplified schematic diagram showing an electronic system that includes a semiconductor device according to some embodiments of the present inventive concepts.

FIG. 1 illustrates a simplified schematic diagram showing an electronic system that includes a semiconductor device according to some embodiments of the present inventive concepts.

Referring to FIG. 1, an electronic system 1000 according to some embodiments of the present inventive concepts may include a semiconductor device 1100 and a controller 1200 electrically connected to the semiconductor device 1100. The electronic system 1000 may be a storage device that includes a single or a plurality of semiconductor devices 1100, or may be an electronic device that includes the storage device. For example, the electronic system 1000 may be a solid state drive (SSD) device, a universal serial bus (USB), a computing system, a medical apparatus, or a communication apparatus, each of which includes a single or a plurality of semiconductor devices 1100.

The semiconductor device 1100 may be a nonvolatile memory device, such as an NAND Flash memory device. The semiconductor device 1100 may include a first structure 1100F and a second structure 1100S on the first structure 1100F. In some embodiments, the first structure 1100F may be disposed on a side of the second structure 1100S.

The first structure 1100F may be a peripheral circuit structure that includes a decoder circuit 1110, a page buffer 1120, and a logic circuit 1130. The second structure 1100S may be a memory cell structure including a bit line BL (e.g., bit lines), a common source line CSL, word lines WL, first and second gate upper lines UL1 and UL2, first and second gate lower lines LL1 and LL2, and memory cell strings CSTR between the bit line BL and the common source line CSL.

For the second structure 1100S, each of the memory cell strings CSTR may include lower transistors LT1 and LT2 adjacent to the common source line CSL, upper transistors UT1 and UT2 adjacent to the bit line BL, and memory cell transistors MCT disposed between the lower transistors LT1 and LT2 and the upper transistors UT1 and UT2. The number of the lower transistors LT1 and LT2 and of the upper transistors UT1 and UT2 may be variously changed in accordance with embodiments.

In some embodiments, the upper transistors UT1 and UT2 may include a string selection transistor, and the lower transistors LT1 and LT2 may include a ground selection transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some embodiments, the lower transistors LT1 and LT2 may include a lower erasure control transistor LT1 and a ground selection transistor LT2 that are connected in series. The upper transistors UT1 and UT2 may include a string selection transistor UT1 and an upper erasure control transistor UT2 that are connected in series. One or both of the lower and upper erasure control transistors LT1 and UT1 may be employed to perform an erase operation in which a gate induced drain leakage (GIDL) phenomenon is used to erase data stored in the memory cell transistors MCT.

The common source line CSL, the first and second gate lower lines LL1 and LL2, the word lines WL, and the first and second gate upper lines UL1 and UL2 may be electrically connected to the decoder circuit 1110 through first connection lines 1115 that extend from the first structure 1100F toward the second structure 1100S. The bit lines BL may be electrically connected to the page buffer 1120 through second connection lines 1125 that extend from the first structure 1100F toward the second structure 1100S.

For the first structure 1100F, the decoder circuit 1110 and the page buffer 1120 may perform a control operation to at least one selection memory cell transistor among the plurality of memory cell transistors MCT. The logic circuit 1130 may control the decoder circuit 1110 and the page buffer 1120. The semiconductor device 1100 may communicate with the controller 1200 through an input/output pad 1101 electrically connected to the logic circuit 1130. The input/output pad 1101 may be electrically connected to the logic circuit 1130 through an input/output connection line 1135 that extends from the first structure 1100F toward the second structure 1100S.

Although not shown, the first structure 1100F may include a voltage generator. The voltage generator may produce program voltages, read voltages, pass voltages, and verification voltages that are required for operating the memory cell strings CSTR. The program voltage may be relatively higher (e.g., about 20 V to about 40 V) than the read voltage, the pass voltage, and the verification voltage.

In some embodiments, the first structure 1100F may include high-voltage transistors and low-voltage transistors. The decoder circuit 1110 may include pass transistors connected to the word lines WL of the memory cell strings CSTR. The pass transistors may include high-voltage transistors capable of withstanding high voltages such as program voltages applied to the word lines WL in a program operation. The page buffer 1120 may also include high-voltage transistors capable of withstanding high voltages.

The controller 1200 may include a processor 1210, a NAND controller 1220, and a host interface 1230. In some embodiments, the electronic system 1000 may include a plurality of semiconductor devices 1100, and in this case, the controller 1200 may control the plurality of semiconductor devices 1100.

The processor 1210 may control an overall operation of the electronic system 1000 that includes the controller 1200. The processor 1210 may operate, for example, based on predetermined firmware, and may control the NAND controller 1220 to access the semiconductor device 1100. The NAND controller 1220 may include a NAND interface 1221 that processes communication with the semiconductor device 1100. The NAND interface 1221 may be used to transfer therethrough a control command to control the semiconductor device 1100, data which is intended to be written on the memory cell transistors MCT of the semiconductor device 1100, and/or data which is intended to be read from the memory cell transistors MCT of the semiconductor device 1100. The host interface 1230 may provide the electronic system 1000 with communication with an external host. When a control command is received through the host interface 1230 from an external host, the semiconductor device 1100 may be controlled by the processor 1210 in response to the control command.

Figure 2:
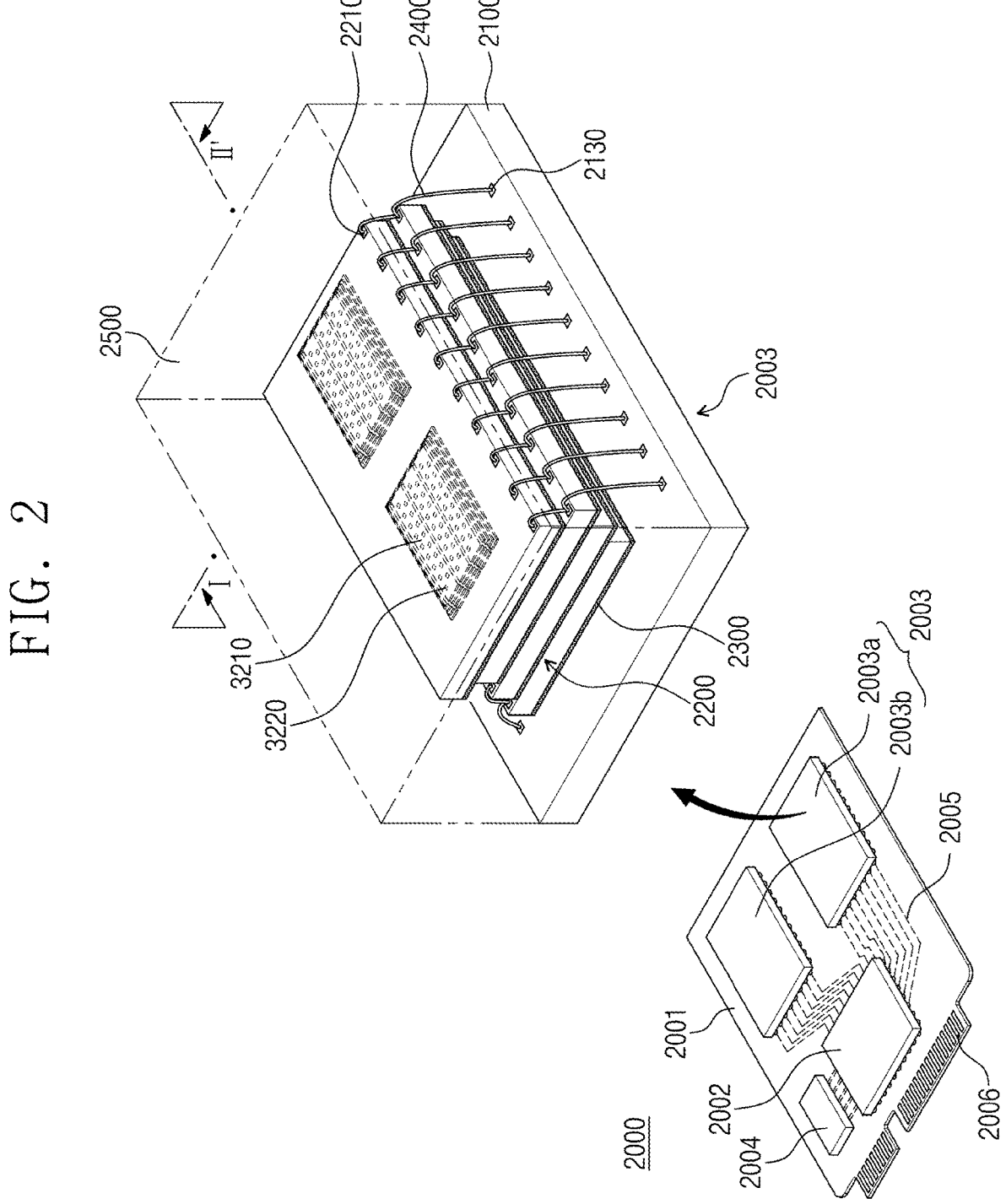
FIG. 2 illustrates a simplified perspective view showing an electronic system that includes a semiconductor device according to some embodiments of the present inventive concepts.

FIG. 2 illustrates a simplified perspective view showing an electronic system that includes a semiconductor device according to some embodiments of the present inventive concepts.

Referring to FIG. 2, an electronic system 2000 according to some embodiments of the present inventive concepts may include a main board 2001, a controller 2002 mounted on the main board 2001, one or more semiconductor packages 2003, and a dynamic random access memory (DRAM) 2004. The semiconductor package 2003 and the DRAM 2004 may be connected to the controller 2002 through wiring patterns 2005 formed on the main board 2001.

The main board 2001 may include a connector 2006 including a plurality of pins (e.g., external connection terminals) that are provided to have connection with an external host. The number and arrangement of the plurality of pins on the connector 2006 may be changed based on a communication interface between the electronic system 2000 and the external host. In some embodiments, the electronic system 2000 may communicate with the external host through one or more interfaces, for example, universal serial bus (USB), peripheral component interconnect express (PIC-Express), serial advanced technology attachment (SATA), and/or M-PHY for universal flash storage (UFS). In some embodiments, the electronic system 2000 may operate with power supplied through the connector 2006 from the external host. The electronic system 2000 may further include a power management integrated circuit (PMIC) by which the power supplied from the external host is distributed to the controller 2002 and the semiconductor package 2003.

The controller 2002 may write data to the semiconductor package 2003, may read data from the semiconductor package 2003, or may increase an operating speed of the electronic system 2000.

The DRAM 2004 may be a buffer memory that reduces a difference in speed between the external host and the semiconductor package 2003 that serves as a data storage space. The DRAM 2004 included in the electronic system 2000 may operate as a kind of cache memory, and may provide a space for temporary data storage in a control operation of the semiconductor package 2003. When the DRAM 2004 is included in the electronic system 2000, the controller 2002 may include not only a NAND controller for controlling the semiconductor package 2003, but a DRAM controller for controlling the DRAM 2004.

The semiconductor package 2003 may include first and second semiconductor packages 2003*a* and 2003*b* that are spaced apart from each other (e.g., horizontally spaced apart from each other). Each of the first and second semiconductor packages 2003*a* and 2003*b* may include a plurality of semiconductor chips 2200. Each of the first and second semiconductor packages 2003*a* and 2003*b* may include a package substrate 2100, semiconductor chips 2200 on the package substrate 2100, adhesion layers 2300 correspondingly disposed on bottom surfaces of the semiconductor chips 2200, connection structures 2400 that electrically connect the semiconductor chips 2200 to the package substrate 2100, and a molding layer 2500 on the package substrate 2100 and covering the semiconductor chips 2200 and the connection structures 2400.

The package substrate 2100 may be a printed circuit board including upper pads 2130. Each of the semiconductor chips 2200 may include one or more input/output pads 2210. The input/output pad 2210 may correspond to the input/output pad 1101 of FIG. 1. Each of the semiconductor chips 2200 may include stack structures 3210 and vertical structures 3220. Each of the semiconductor chips 2200 may include or may be a semiconductor device according to some embodiments of the present inventive concepts which will be discussed below. As described herein, a semiconductor device may refer to a semiconductor chip, a semiconductor package, or a package-on-package device, for example. A package, as described herein, includes a package substrate, one or more semiconductor chips mounted on the package substrate, and a molding layer, or encapsulation layer, covering the package substrate and the one or more semiconductor chips.

In some embodiments, the connection structures 2400 may be bonding wires that electrically connect the input/output pads 2210 to the upper pads 2130. Therefore, for each of the first and second semiconductor packages 2003*a* and 2003*b*, the semiconductor chips 2200 may be electrically connected to each other in a wire bonding manner, and may be electrically connected to the upper pads 2130 of the package substrate 2100. In some embodiments, on each of the first and second semiconductor packages 2003*a* and 2003*b*, the semiconductor chips 2200 may be electrically connected to each other using through-silicon vias (TSVs) instead of the connection structures 2400 or the bonding wires.

In some embodiments, the controller 2002 and the semiconductor chips 2200 may be included in a single package. For example, the controller 2002 and the semiconductor chips 2200 may be mounted on an interposer substrate other than the main board 2001, and may be connected to each other through wiring lines formed on the interposer substrate.

Figure 3:
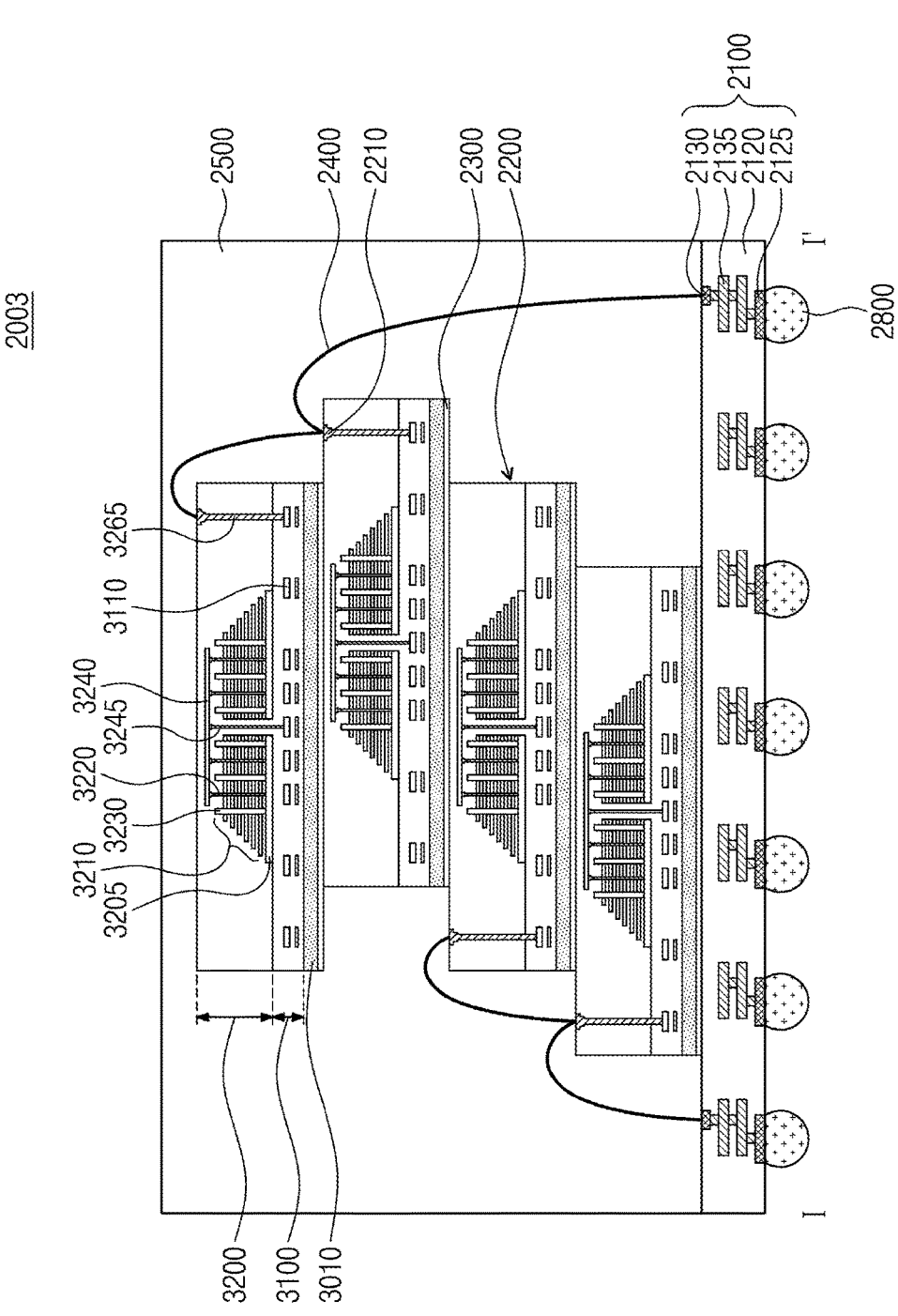
FIGS. 3 and 4 illustrate simplified cross-sectional views showing a semiconductor package according to some embodiments of the present inventive concepts.
Figure 4:
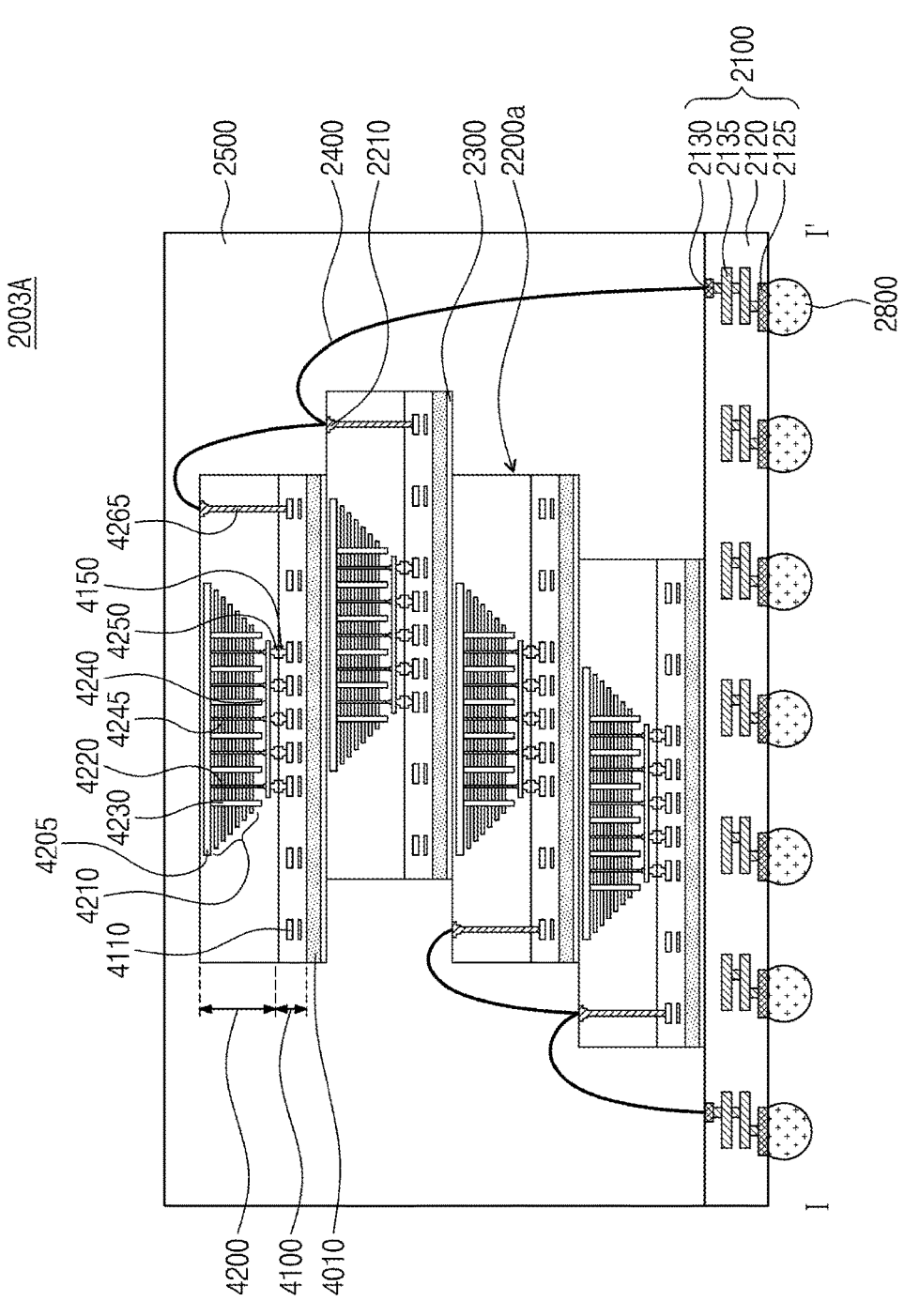

FIGS. 3 and 4 illustrate simplified cross-sectional views showing a semiconductor package according to some embodiments of the present inventive concepts. FIGS. 3 and 4 each depicts an example of the semiconductor package illustrated in FIG. 2, conceptually showing a section taken along line I-I' of the semiconductor package illustrated in FIG. 2.

Referring to FIG. 3, a printed circuit board may be used as the package substrate 2100 of the semiconductor package 2003. The package substrate 2100 may include a package substrate body 2120, upper pads (see 2130 of FIG. 2) disposed on a top surface of the package substrate body 2120, lower pads 2125 disposed or exposed on a bottom surface of the package substrate body 2120, and internal lines 2135 through which the upper pads 2130 and the lower pads 2125 are electrically connected within the package substrate body 2120. The upper pads 2130 may be electrically connected to the connection structures 2400. The lower pads 2125 may be connected through conductive connectors 2800 to the wiring patterns 2005 of the main board 2001 in the electronic system 2000, as shown in FIG. 2.

Each of the semiconductor chips 2200 may include a semiconductor substrate 3010, and may also include a first structure 3100 and a second structure 3200 that are sequentially stacked on the semiconductor substrate 3010. The first structure 3100 may include a peripheral circuit region including peripheral wiring lines 3110. The second structure 3200 may include a source structure 3205, a stack structure 3210 on the source structure 3205, vertical structures 3220 and separation structures 3230 that penetrate the stack structure 3210, bit lines 3240 electrically connected to the vertical structures 3220, and cell contact plugs electrically connected to the word lines (see WL of FIG. 1) of the stack structure 3210. Each of the first structure 3100, the second structure 3200, and the semiconductor chips 2200 may further include separation structures which will be discussed below.

Each of the semiconductor chips 2200 may include one or more through lines 3245 that electrically connect with the peripheral wiring lines 3110 of the first structure 3100 and extend into the second structure 3200. The through line 3245 may be disposed outside the stack structure 3210 and may further be disposed to penetrate the stack structure 3210. Each of the semiconductor chips 2200 may further include one or more input/output pads (see 2210 of FIG. 2) electrically connected to the peripheral wiring lines 3110 of the first structure 3100.

Referring to FIG. 4, a semiconductor package 2003A may be configured such that each of semiconductor chips 2200a may include a semiconductor substrate 4010, a first structure 4100 on the semiconductor substrate 4010, and a second structure 4200 on the first structure 4100 and coupled to the first structure 4100 in a wafer bonding manner.

The first structure 4100 may include a peripheral circuit region including peripheral wiring lines 4110 and first bonding structures 4150. The second structure 4200 may include a source structure 4205, a stack structure 4210 between the source structure 4205 and the first structure 4100, vertical structures 4220 and separation structures 4230 that penetrate the stack structure 4210, and second bonding structures 4250 electrically connected to corresponding vertical structures 4220 and corresponding word lines (see WL of FIG. 1) of the stack structure 4210. For example, the second bonding structures 4250 may be electrically connected to the vertical structures 4220 and the word lines (see WL of FIG. 1) through bit lines 4240 electrically connected to the vertical structures 4220 and through cell contact plugs electrically connected to the word lines (see WL of FIG. 1). The first bonding structures 4150 of the first structure 4100 and the second bonding structures 4250 of the second structure 4200 may be coupled to each other while being in contact with each other. The first and second bonding structures 4150 and 4250 may have their bonding portions formed of, for example, copper (Cu). The term "contact," as used herein, refers to a direct connection (i.e., touching) unless the context indicates otherwise. Also, It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present at the point of contact.

Each of the first structure 4100, the second structure 4200, and the semiconductor chip 2200a may further include a source structure which will be discussed below. Each of the semiconductor chips 2200a may further include one or more input/output pads (see 2210 of FIG. 2) electrically connected to the peripheral wiring lines 4110 of the first structure 4100.

The semiconductor chips 2200 of FIG. 3 may be electrically connected to each other through the connection structures 2400 shaped like bonding wires, and this may also be applicable to the semiconductor chips 2200a of FIG. 4. In some embodiments, semiconductor chips, such as the semiconductor chips 2200 of FIG. 3 or the semiconductor chips 2200a of FIG. 4, in a single semiconductor package may be electrically connected to each other through one or more connection structures that include through electrodes such as TSV (through silicon via).

The first structure 3100 of FIG. 3 and the first structure 4100 of FIG. 4 may each correspond to a peripheral circuit structure in the following described embodiments, and the second structure 3200 of FIG. 3 and the second structure 4200 of FIG. 4 may each correspond to a cell array structure in the following described embodiments.

Figure 5:
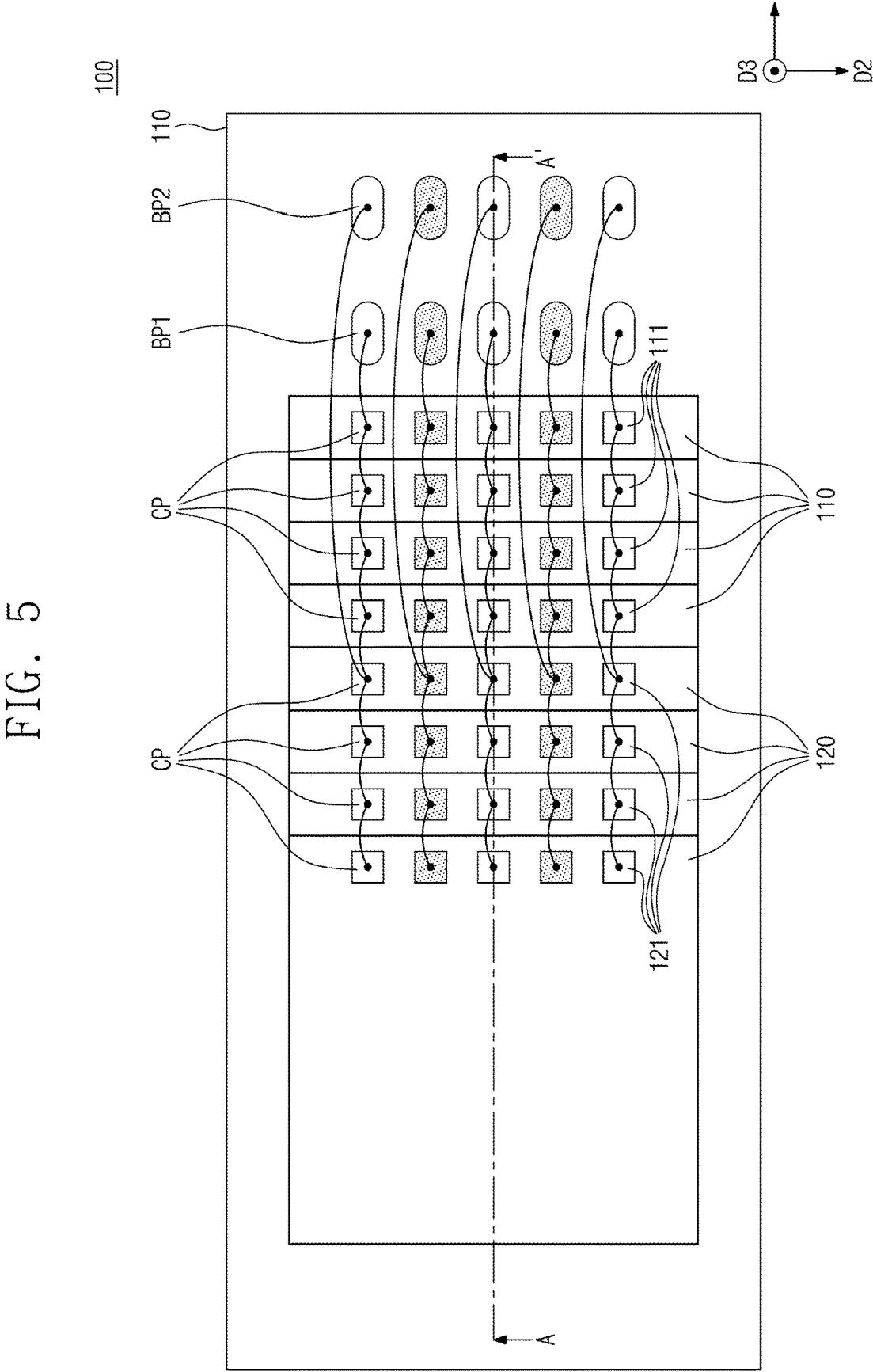
FIG. 5 illustrates a plan view showing a semiconductor package according to some embodiments of the present inventive concepts.
Figure 6:
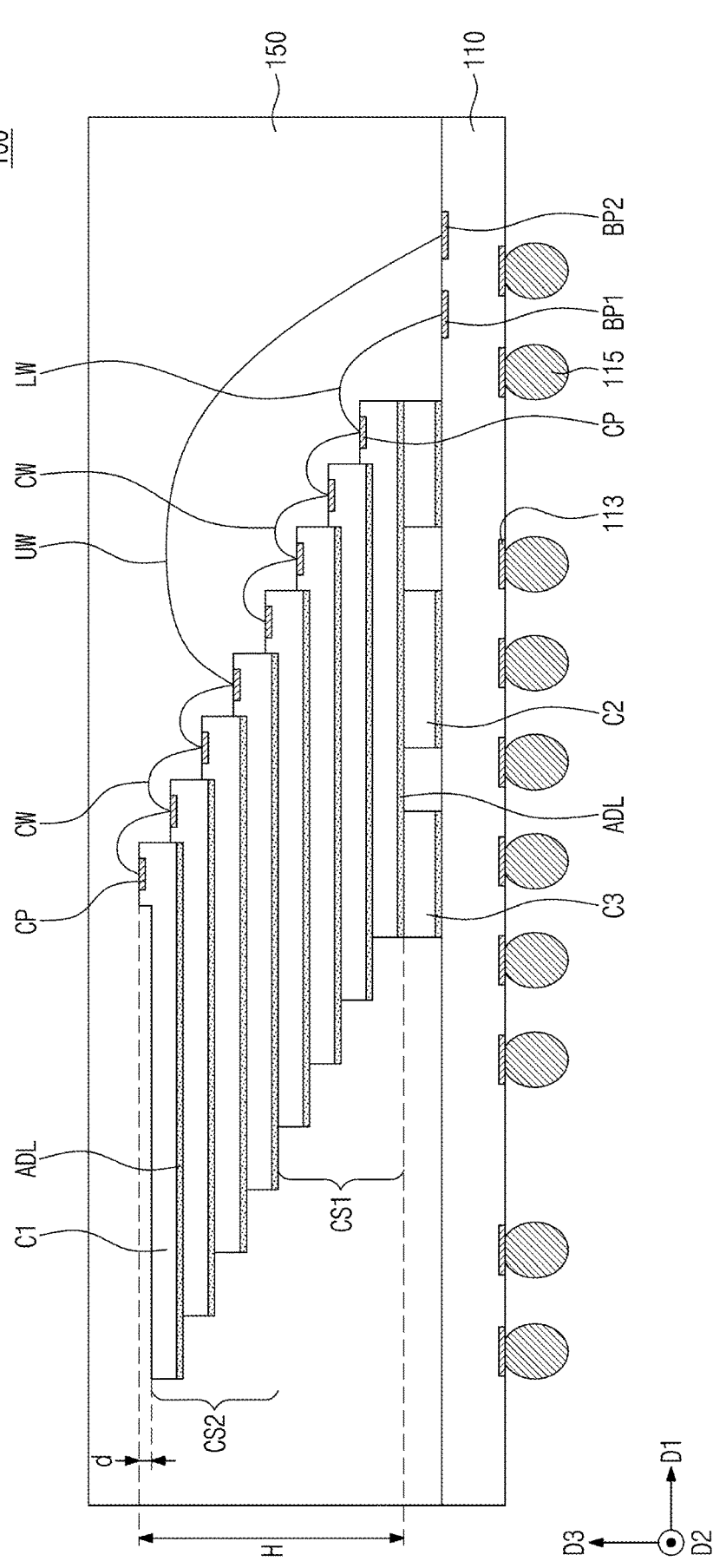
FIG. 6 illustrates a cross-sectional view taken along line A-A' of FIG. 5, showing a semiconductor package according to some embodiments of the present inventive concepts.
Figure 7:
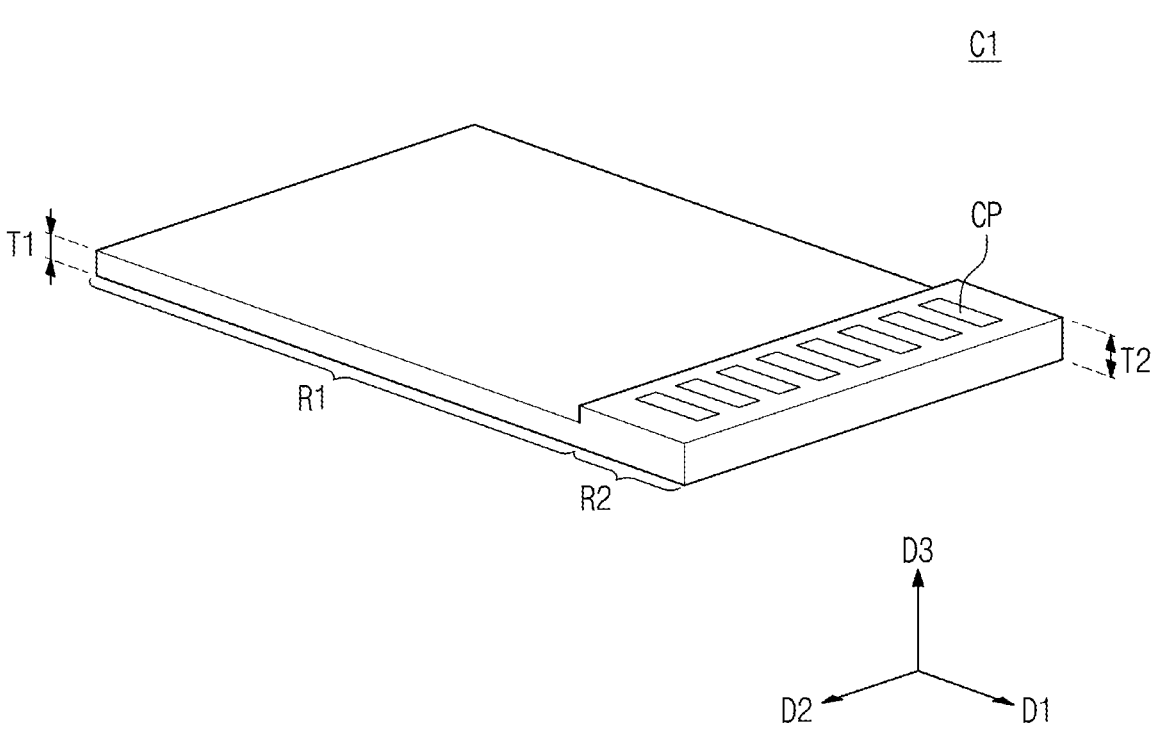
FIG. 7 illustrates a simplified perspective view showing a semiconductor chip according to some embodiments of the present inventive concepts.
Figures 8A, 8B:
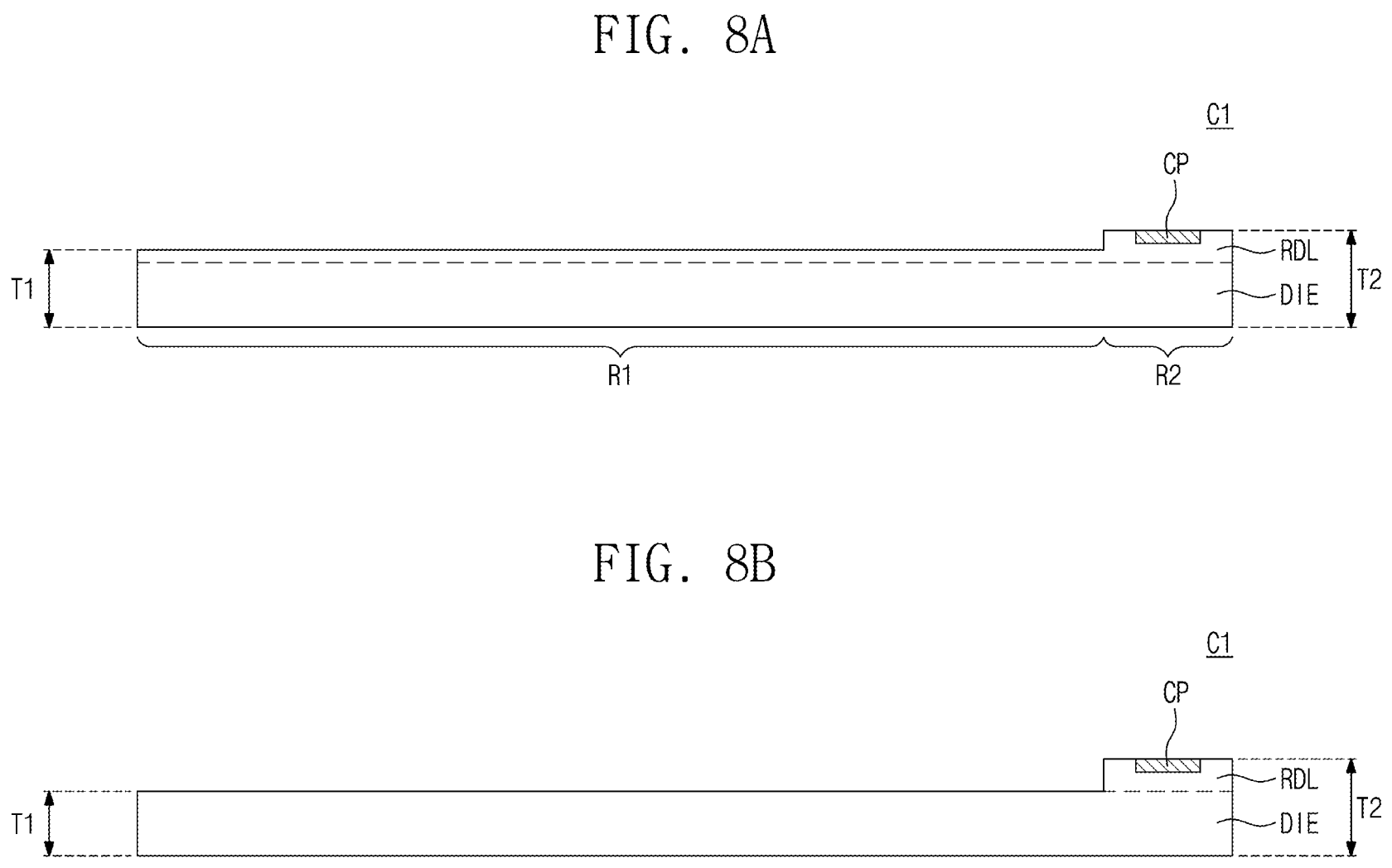

FIG. 5 illustrates a plan view showing a semiconductor package according to some embodiments of the present inventive concepts. FIG. 6 illustrates a cross-sectional view taken along line A-A' of FIG. 5, showing a semiconductor package according to some embodiments of the present inventive concepts. FIG. 7 illustrates a simplified perspective view showing a semiconductor chip according to some embodiments of the present inventive concepts. FIGS. 8A and 8B illustrate simplified cross-sectional views showing a semiconductor chip according to some embodiments of the present inventive concepts.

Referring to FIGS. 5 and 6, a semiconductor package 100 may include a package substrate 110, a first chip stack CS1 on the package substrate 110, a second chip stack CS2 on the first chip stack CS1, lower wires LW, upper wires UW, connection wires CW, and a molding layer 150.

A printed circuit board (PCB), a flexible substrate, a tape substrate, or any other kind of substrate may be used as the package substrate 110. For example, the package substrate 110 may be a printed circuit board in which internal lines are formed.

The package substrate 110 may include bonding pads BP1 and BP2 disposed on a top surface thereof and coupling pads 113 disposed on a bottom surface thereof.

The bonding pads BP1 and BP2 may be electrically connected through internal lines to the coupling pads 113. The bonding pads BP1 and BP2 may be electrically connected through metallic wires to chip pads CP of the first and second chip stacks CS1 and CS2. The coupling pads 113 may be attached thereto with connection terminals 115 such as solder balls or solder bumps.

The first bonding pads BP1 may be arranged equally spaced apart from each other along a second direction D2, while being adjacent to the first chip stack CS1. The second bonding pads BP2 may be arranged spaced apart in a first direction D1 from the first bonding pads BP1, for example, to also be arranged equally spaced apart from each other along the second direction D2. The first and second bonding pads BP1 and BP2 may be connected to signal terminals or power/ground terminals.

Each of the first and second chip stacks CS1 and CS2 may include a plurality of first semiconductor chips C1 (or semiconductor devices) that are stacked on a package substrate 110. The first semiconductor chips C1 may be stacked along the first direction D1 on the package substrate 110, thereby constituting a staircase or cascade structure. The first semiconductor chips C1 may be attached to each other through an adhesive layer ADL.

For example, each of the first and second chip stacks CS1 and CS2 may include four first semiconductor chips C1 that are stacked on the package substrate 110. For each of the first and second chip stacks CS1 and CS2, the number of stacked first semiconductor chips C1 is not limited to that shown and may be 6, 8, or 16. In addition, the number of stacked first semiconductor chips C1 in the first chip stack CS1 may be different from that of stacked first semiconductor chips C1 in the second chip stack CS2.

The first semiconductor chips C1 may be memory chips that store data. For example, the first semiconductor chips C1 may be dynamic random access memory (DRAM) chips, static random access memory (SRAM) chips, NAND Flash memory chips, phase change random access memory (PRAM) chips, resistive random access memory (RRAM) chips, ferromagnetic random access memory (FeRAM) chips, or magnetic random access memory (MRAM) chips. The first semiconductor chips C1 in one embodiment are all the same type of chip. However, in other embodiments, different first semiconductor chips C1 can be different types of chips.

According to some embodiments, the semiconductor package 100 may further include a second semiconductor chip C2 and a third semiconductor chip C3 between the package substrate 110 and the first chip stack CS1.

The second semiconductor chip C2 may be a logic chip, such as a controller. The second semiconductor chip C2 may have a width in the first direction D1 less than a width in the first direction D1 of the first semiconductor chip C1. The third semiconductor chip C3 may have a vertical thickness substantially the same as that of the second semiconductor chip C2. The third semiconductor chip C3 may be either a support or a dummy semiconductor chip that is configured similar to the second semiconductor chip C2. The second semiconductor chip C2 and the third semiconductor chip C3 may be mounted at the same level (e.g., vertical level). The second semiconductor chip C2 and the third semiconductor chip C3 may have their top surfaces at substantially the same level. Terms such as "same," "equal," "planar," "coplanar," "parallel," and "perpendicular," as used herein encompass identicality or near identicality including variations that may occur, for example, due to manufacturing processes. The term "substantially" may be used herein to emphasize this meaning, unless the context or other statements indicate otherwise. Also, spatially relative terms, such as "beneath," "below," "lower," "above," "upper," "top," "bottom," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly. Also these spatially relative terms such as "above" and "below" as used herein have their ordinary broad meanings—for example element A can be above element B even if when looking down on the two elements there is no overlap between them.

For each of the first and second chip stacks CS1 and CS2, the connection wires CW may electrically connect to each other the chip pads CP of the first semiconductor chips C1. For example, for the first chip stack CS1, each connection wire CW may connect two adjacent first chips, and for the second chip stack CS2, each connection wire CW may connect two adjacent first chips.

For the first chip stack CS1, the lower wires LW may connect the chip pads CP of a lowermost first semiconductor chip C1 to the first bonding pads BP1 of the package substrate 110.

For the second chip stack CS2, the upper wires UW may connect the chip pads CP of a lowermost first semiconductor chip C1 to the second bonding pads BP2 of the package substrate 110. The upper wires UW may be longer than the lower wires LW. The upper wires UW may pass over the connection wires CW and the lower wires LW, thereby being bonded to the second bonding pads BP2.

On the top surface of the package substrate 110, the molding layer 150 may cover the first and second chip stacks CS1 and CS2 and may also cover the lower, upper, and connection bonding wires LW, UW, and CW. The molding layer 150 may include or be formed of a dielectric polymer, such as an epoxy molding compound (EMC). The various wires and pads described herein may be formed of a conductive material, such as a metal, for example.

Referring to FIGS. 7, 8A, and 8B, each of the first semiconductor chips C1 may include a stack region R1 and a pad region R2.

Each of the first semiconductor chips C1 may include the chip pads CP that are arranged along the second direction D2 on the pad region R2. For each of the first semiconductor chips C1, the chip pads CP may include signal pads through which signals are input or output, and may also include power/ground pads to which power or ground signals are input. The chip pads CP may be formed to have a flat surface and may be formed at a surface of a respective first semiconductor chip C1.

Figure 9:
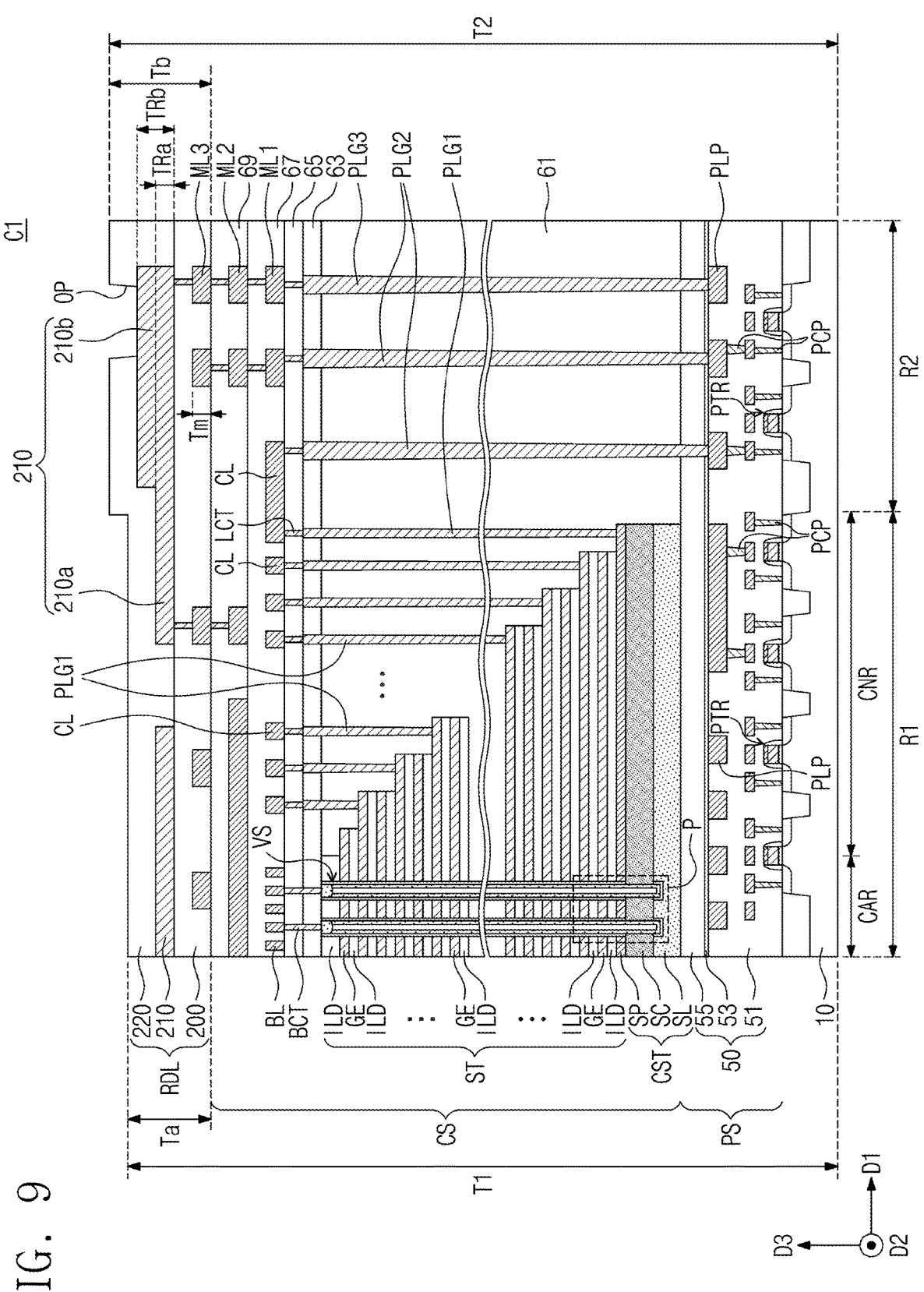
FIGS. 9 to 13 illustrate cross-sectional views showing a semiconductor chip according to some embodiments of the present inventive concepts.

Each of the first semiconductor chips C1 may have a first thickness T1 on the stack region R1 and a second thickness T2, which is greater than the first thickness T1, on the pad region R2. A difference d between the first thickness T1 and the second thickness T2 may be less than the first thickness T1. The pad region R2 may be adjacent to an edge of each first semiconductor chip C1, which may be between the edge of a respective first semiconductor chip C1 and the stack region R1. The thickness of the semiconductor chip may include a thickness between a top-most surface and a bottom-most surface of the semiconductor chip, and in some embodiments (e.g., as can be seen in FIG. 9 and other figures), there is no pad or conductive line extending vertically beyond a top-most surface of the semiconductor chip (e.g., beyond a top-most insulating layer surface of the semiconductor chip).

The first semiconductor chips C1 may be stacked while exposing the pad regions R2 (or the chip pads CP) of underlying first semiconductor chips C1. The pad regions R2 of the first semiconductor chips C1 may be horizontally and vertically spaced apart from each other. The stack region R1 of each first semiconductor chip C1 may overlap its overlying first semiconductor chip C1.

A redistribution layer RDL may be provided on top of each of the first semiconductor chips C1 to allow easy wire bonding between the package substrate 110 and the first semiconductor chip C1. The redistribution layer RDL may distribute signals between the wire bonding wires and internal circuitry of the cell array structure CS and peripheral circuit structure PS. For example, the redistribution layer RDL may be formed on top of a group of metal layers.

The redistribution layer RDL may include a redistribution dielectric layer and a redistribution pattern. The chip pads CP of each first semiconductor chip C1 may a portion of the redistribution pattern.

For example, referring to FIG. 8A, the redistribution layer RDL may be provided on the stack region R1 and the pad region R2 of the first semiconductor chip C1, and may have a thickness that is greater on the pad region R2 than on the stack region R1.

For another example, referring to FIG. 8B, the redistribution layer RDL may be formed only on the pad region R2 of the first semiconductor chip C1.

When the redistribution layer RDL is formed on each first semiconductor chip C1, the first and second chip stacks CS1 and CS2 may have a thickness that is increased as much as that of the redistribution layer RDL. However, according to the present inventive concepts, as the redistribution layer RDL is formed to have a thickness that is greater on the pad region R2 than on the stack region R1, the thickness of the first and second chip stacks CS1 and CS2 may be prevented from increasing in proportion to the thickness of the redistribution layer RDL.

Referring to FIG. 6, in some embodiments, a total thickness H of the first and second chip stacks CS1 and CS2 may correspond to a value obtaining by adding the difference d between the first thickness T1 and the second thickness T2 to the product of the first thickness T1 of the stack region R1 and the number of stacked first semiconductor chips C1.

FIGS. 9 to 13 illustrate cross-sectional views partially showing a semiconductor chip according to some embodiments of the present inventive concepts. FIG. 14 illustrates an enlarged view showing section P of FIG. 9.

Referring to FIGS. 9 to 13, a semiconductor chip C1 (or semiconductor device) according to some embodiments of the present inventive concepts may include a semiconductor substrate 10 and may also include a peripheral circuit structure PS and a cell array structure CS that are sequentially stacked on the semiconductor substrate 10.

Each of the peripheral circuit structure PS and the cell array structure CS may include a stack region R1 and a pad region R2, and the stack region R1 may include a cell array region CAR and a connection region CNR.

The peripheral circuit structure PS may include peripheral circuits PTR integrated on an entire surface of the semiconductor substrate 10 and a peripheral circuit dielectric layer 50 that covers the peripheral circuits PTR. The semiconductor substrate 10 may be a silicon substrate. The semiconductor substrate 10 may include the cell array region CAR and the connection region CNR.

The peripheral circuits PTR may be row and column decoders, a page buffer, and a control circuit. For example, the peripheral circuits PTR may include NMOS and PMOS transistors. Peripheral circuit lines PLP may be electrically connected to the peripheral circuits PTR through peripheral contact plugs PCP.

The peripheral circuit dielectric layer 50 may be provided on the entire surface of the semiconductor substrate 10. On the semiconductor substrate 10, the peripheral circuit dielectric layer 50 may cover the peripheral circuits PTR, the peripheral contact plugs PCP, and the peripheral circuit lines PLP. The peripheral contact plugs PCP and the peripheral circuit lines PLP may be electrically connected to the peripheral circuits PTR.

The peripheral circuit dielectric layer 50 may include a plurality of stacked dielectric layers. For example, the peripheral circuit dielectric layer 50 may include or be formed of one or more of a silicon oxide layer, a silicon nitride layer, a silicon oxynitride layer, and a low-k dielectric layer. The peripheral circuit dielectric layer 50 may include, for example, a first lower dielectric layer 51, a second lower dielectric layer 55, and an etch stop layer 53 between the first and second lower dielectric layers 51 and 55. The etch stop layer 53 may include or be formed of a dielectric material different from that of the first and second lower dielectric layers 51 and 55, and may cover top surfaces of uppermost peripheral circuit lines PLP.

The cell array structure CS may be disposed on the peripheral circuit dielectric layer 50. The cell array structure CS may include a source structure CST, a stack structure ST, vertical structures VS, first to third contact plugs PLG1 to PLG3, bit lines BL, and conduction lines CL.

The source structure CST may be disposed between the peripheral circuit dielectric layer 50 and the stack structure ST. The source structure CST may extend in a first direction D1 along the stack structure ST on the cell array region CAR and the connection region CNR.

The source structure CST may include a semiconductor layer SL, a source conductive pattern SC, and a support conductive pattern SP on the source conductive pattern SC.

According to some embodiments, the memory cell strings CSTR depicted in FIG. 1 may be integrated on the peripheral circuit structure PS. The stack structure ST and the vertical structures VS may constitute the memory cell strings CSTR depicted in FIG. 1.

The semiconductor layer SL may be disposed on a top surface of the peripheral circuit dielectric layer 50. The semiconductor layer SL may be formed of a semiconductor material. The semiconductor layer SL may include a semiconductor doped with impurities having a first conductivity type (e.g., n-type) or an intrinsic semiconductor doped with no impurities. The semiconductor layer SL may include at least one selected from a single crystalline structure, an amorphous structure, and a polycrystalline structure.

The source conductive pattern SC may be disposed between the semiconductor layer SL and the stack structure ST on the cell array region CAR. The source conductive pattern SC may be formed of a semiconductor material doped with impurities having the first conductivity type, for example, phosphorus (P) or arsenic (As). For example, the source conductive pattern SC may be formed of a polysilicon layer doped with n-type impurities.

The support conductive pattern SP may cover a top surface of the source conductive pattern SC on the cell array region CAR. The support conductive pattern SP may include one or more of a semiconductor doped with impurities having the first conductivity type (e.g., n-type) and an intrinsic semiconductor doped with no impurities.

The stack structure ST may be disposed on the source structure CST. The stack structure ST may extend from the cell array region CAR toward the connection region CNR along the first direction D1, and may have a stepwise structure on the connection region CNR.

The stack structure ST may include electrodes GE and dielectric layers ILD that are alternately stacked along a third direction D3 (or a vertical direction) perpendicular to the first and second directions D1 and D2 that intersect each other. The gate electrodes GE may include or be formed of, for example, at least one selected from doped semiconductor (e.g., doped silicon), metal (e.g., tungsten, copper, or aluminum), conductive metal nitride (e.g., titanium nitride or tantalum nitride), and transition metal (e.g., titanium or tantalum). The dielectric layers ILD may include or be formed of one or more of a silicon oxide layer and a low-k dielectric layer. According to some embodiments, a semiconductor device may be a vertical NAND Flash memory device, and in this case, the electrodes GE of the stack structure ST may be used as the gate lower lines LL1 and LL2, the word lines WL, and the gate upper lines UL1 and UL2 that are discussed with reference to FIG. 1.

The electrodes GE may be stacked on the source structure CST to have a stepwise structure on the connection region CNR. Each of the electrodes GE may include a pad portion on the connection region CNR. The pad portions of the electrodes GE may be located at positions that are horizontally and vertically different from each other. The first contact plugs PLG1 may be correspondingly coupled to the pad portions of the electrodes GE.

A plurality of vertical structures VS may penetrate the stack structures ST on the cell array region CAR. Although not shown, dummy structure structures may be provided to have the same structure as that of the vertical structures VS and to penetrate the pad portions of the electrodes GE on the connection region CNR.

Referring to FIG. 14, each of the vertical structures VS may include a vertical semiconductor pattern VP and a data storage pattern DSP that surrounds a sidewall of the vertical semiconductor pattern VP. For example, the vertical semiconductor pattern VP may have a macaroni shape or a pipe shape whose bottom end is closed, also described as a cup shape. The vertical semiconductor pattern VP may be shaped like U, and may have an inside filled with a dielectric material. The vertical semiconductor pattern VP may include or be formed with a semiconductor material, such as silicon (Si), germanium (Ge), or a mixture thereof. The vertical channel pattern VP including the semiconductor material may be used as channels of the upper transistors UT1 and UT2, of the memory cell transistors MCT, and of the lower transistors LT1 and LT2, all of which transistors are discussed with reference to FIG. 1.

The data storage pattern DSP may extend in the third direction D3 and may surround the sidewall of the vertical semiconductor pattern VP. The data storage pattern DSP may have a macaroni shape or a pipe shape whose top and bottom ends are opened. The data storage pattern DSP may be formed of a single thin layer or a plurality of thin layers. In some embodiments of the present inventive concepts, the data storage pattern DSP may include a tunnel dielectric layer TIL, a charge storage layer CIL, and a blocking dielectric layer BLK that are sequentially stacked on the sidewall of the vertical semiconductor pattern VP, which layers TIL, CIL, and BLK constitute a data storage layer of a NAND Flash memory device. For example, the charge storage layer CIL may be a trap dielectric layer, a floating gate electrode, or a dielectric layer including conductive nano-dots. In addition, the semiconductor layer SL may be provided therein with a residual data storage pattern RDSP that is vertically spaced apart from the data storage pattern DSP. The residual data storage pattern RDSP may have a film structure the same as that of the data storage pattern DSP.

A horizontal dielectric pattern HP may be provided between the data storage pattern DSP and sidewalls of electrodes GE. The horizontal dielectric patterns HP may extend onto top and bottom surfaces of the electrodes GE from the sidewalls of the electrodes GE.

For each vertical structure VS, a portion of the sidewall of the vertical semiconductor pattern VP may be in contact with the source conductive pattern SC. For each vertical structure VS, a bottom surface of the data storage pattern DSP may be located at a level lower than that of the bottom surface of a lowermost electrode GE and higher than that of the top surface of the source conductive pattern SC.

Referring back to FIG. 9, a planarized dielectric layer 61 may be disposed on the peripheral circuit dielectric layer 50 and may cover the stepwise structure of the stack structure ST. The planarized dielectric layer 61 may have a substantially flat top surface. For example, the top surface of the planarized dielectric layer 61 may be located at substantially the same level as that of top surfaces of the vertical structures VS. The planarized dielectric layer 61 may include a single dielectric layer or a plurality of stacked dielectric layers. The planarized dielectric layer 61 may include or be formed of one or more of a silicon oxide layer, a silicon nitride layer, a silicon oxynitride layer, and a low-k dielectric layer.

First, second, third, and fourth interlayer dielectric layers 63, 65, 67, and 69 may be sequentially stacked on the planarized dielectric layer 61. The first, second, third, and fourth interlayer dielectric layers 63, 65, 67, and 69 may include or be formed of a dielectric material, such as silicon oxide or silicon nitride.

The second interlayer dielectric layer 65 may be provided with the bit lines BL formed thereon, which run across the stack structure ST and extend in the second direction D2. The bit lines BL may be electrically connected through bit-line contact plugs BCT to the vertical structures VS.

On the connection region CNR, the first contact plugs PLG1 may penetrate the first interlayer dielectric layer 63 and the planarized dielectric layer 61, thereby being coupled to corresponding pad portions of the electrodes GE. The first contact plugs PLG1 may have their vertical lengths that decrease with decreasing distance from the cell array region CAR. The first contact plugs PLG1 may have their top surfaces that are substantially coplanar with each other.

On the pad region R2, the second contact plugs PLG2 may penetrate the first interlayer dielectric layer 63, the planarized dielectric layer 61, and a portion of the peripheral circuit dielectric layer 50, thereby being coupled to the peripheral circuit lines PLP. The second contact plugs PLG2 may have their top surfaces substantially coplanar with those of the first contact plugs PLG1.

On the pad region R2, the third contact plugs PLG3 may penetrate the first interlayer dielectric layer 63, the planarized dielectric layer 61, and a portion of the peripheral circuit dielectric layer 50, thereby being coupled to the peripheral circuit lines PLP. The third contact plugs PLG3 may be spaced apart from the source structure CST and the stack structure ST. The third contact plugs PLG3 may have their top surfaces substantially coplanar with those of the second contact plugs PLG2.

Each of the first, second, and third contact plugs PLG1, PLG2, and PLG3 may include or be formed of a barrier metal layer forming of conductive metal nitride (e.g., titanium nitride or tantalum nitride) and a metal layer forming of metal (e.g., tungsten, titanium, or tantalum).

The connection lines CL may be disposed on the second interlayer dielectric layer 65, and may be connected through connection contact plugs LCT to the first contact plugs PLG1.

First, second, and third metal lines ML1, ML2, and ML3 may be stacked on the pad region R2. The first, second, and third metal lines ML1, ML2, and ML3 may be located at different levels (e.g. vertical levels) from each other, and may be connected to each other through contact plugs. The first, second, and third metal lines ML1, ML2, and ML3 may include or be formed of, for example, at least one selected from metal (e.g., tungsten, copper, or aluminum), conductive metal nitride (e.g., titanium nitride or tantalum nitride), and transition metal (e.g., titanium or tantalum). In some embodiments, each metal line of metals lines ML1, ML2, and ML3 forms an elongated rectangular shape when viewed from a plan view.

In some embodiments, it is shown and described that four interlayer dielectric layers are stacked on the planarized dielectric layer 61, but the present inventive concepts are not limited thereto.

According to some embodiments, a redistribution layer RDL may be disposed on the fourth interlayer dielectric layer 69, or an uppermost one of the first, second, third, and fourth interlayer dielectric layers 63, 65, 67, and 69. The redistribution layer RDL may include a redistribution dielectric layer 200, a redistribution pattern 210, and a passivation layer 220.

The redistribution dielectric layer 200 may be disposed on the fourth interlayer dielectric layer 69, and may cover the third metal line ML3 or an uppermost one of the first, second, and third metal lines ML1, ML2, and ML3. The redistribution dielectric layer 200 may be formed of a single layer or multiple layers. The redistribution dielectric layer 200 may include one or more of a high density plasma (HDP) layer, a tetraethylorthosilicate (TEOS) layer, a silicon nitride layer, and a silicon oxynitride layer.

The redistribution pattern 210 may include a line portion 210a disposed on the stack region R1 and a pad portion 210b provided on the pad region R2. The redistribution pattern 210 may be connected to the third metal line ML3 through a via that penetrates the fourth interlayer dielectric layer 69. A data signal or a power/ground signal may be externally input through the pad portion 210b of the redistribution pattern 210. The pad portion 210b of the redistribution pattern 210 may be electrically connected through the third contact plug PLG3 to the peripheral circuits PTR of the peripheral circuit structure PS. For example, a plurality of peripheral circuits may correspond to a plurality of transistors that form different components of a peripheral circuit structure PS of a semiconductor device.

The redistribution pattern 210 may be formed of, for example, at least one selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and an alloy thereof. In some embodiments, the redistribution pattern 210 may include or be formed of a metallic material different from that of the first, second, and third metal lines ML1, ML2, and ML3 (which in some embodiments may all be formed of the same materials). Though a plan view is not shown for FIG. 9, the redistribution pattern 210 may include straight line portions connected to each other to form a circuit pattern. The straight line portions may contact each other, and may extend in the D1 and D2 directions as well as in diagonal directions along the horizontal D1/D2 plane.

The passivation layer 220 may have a substantially uniform thickness, and a top surface of the passivation layer 220 on the stack region R1 may be lower than that of the passivation layer 220 on the pad region R2. On the stack region R1, the passivation layer 220 may cover (e.g., directly) and may contact a top surface at the line portion 210a of the redistribution pattern 210. On the pad region R2, the passivation layer 220 may have an opening OP that exposes a top surface at the pad portion 210b of the redistribution pattern 210. The pad portion 210b of the redistribution portion 210 may include the portion that is exposed with respect to the passivation layer 220 as well as an additional portion that is thicker than the line portion 210a in the vertical (D3) direction and that is covered by the passivation layer 220. The passivation layer 220 may include or be formed of one or more of silicon nitride, silicon oxynitride, and photosensitive polyimide (PSPI).

According to some embodiments, the redistribution layer RDL may have a larger thickness Tb on the pad region R2 and a smaller thickness Ta on the stack region R1. For example, the redistribution layer RDL may have a bottom (e.g., bottom-most) surface at a first vertical level in both the pad region R2 and the stack region R1, but may have a top surface (e.g., top-most surface) at a second vertical level in the pad region R2 and at a third vertical level in the stack region R1, wherein the second vertical level is higher than the third vertical level.

According to the embodiment shown in FIG. 9, the redistribution dielectric layer 200 may have a substantially uniform thickness (e.g., a uniform thickness other than where the metal lines ML3 are formed, or a uniform thickness from a top-most surface to a bottom-most surface) on the stack region R1 and the pad region R2. The redistribution pattern 210 may be configured such that a thickness TRb (e.g., a maximum thickness) of the pad portion 210b is greater than a thickness TRa (e.g., a maximum thickness) of the line portion 210a. The thickness TRa of the line portion 210a may be in a range from about 0.5 μm to about 0.6 μm, and the thickness TRb of the pad portion 210b may be in a range from about 1.0 μm to about 1.2 μm. The thickness TRb of the pad portion 210b of the redistribution pattern 210 may be greater than a thickness Tm of the third metal line ML3 or an uppermost one of the metal lines ML1, ML2, and ML3.

Figure 10:
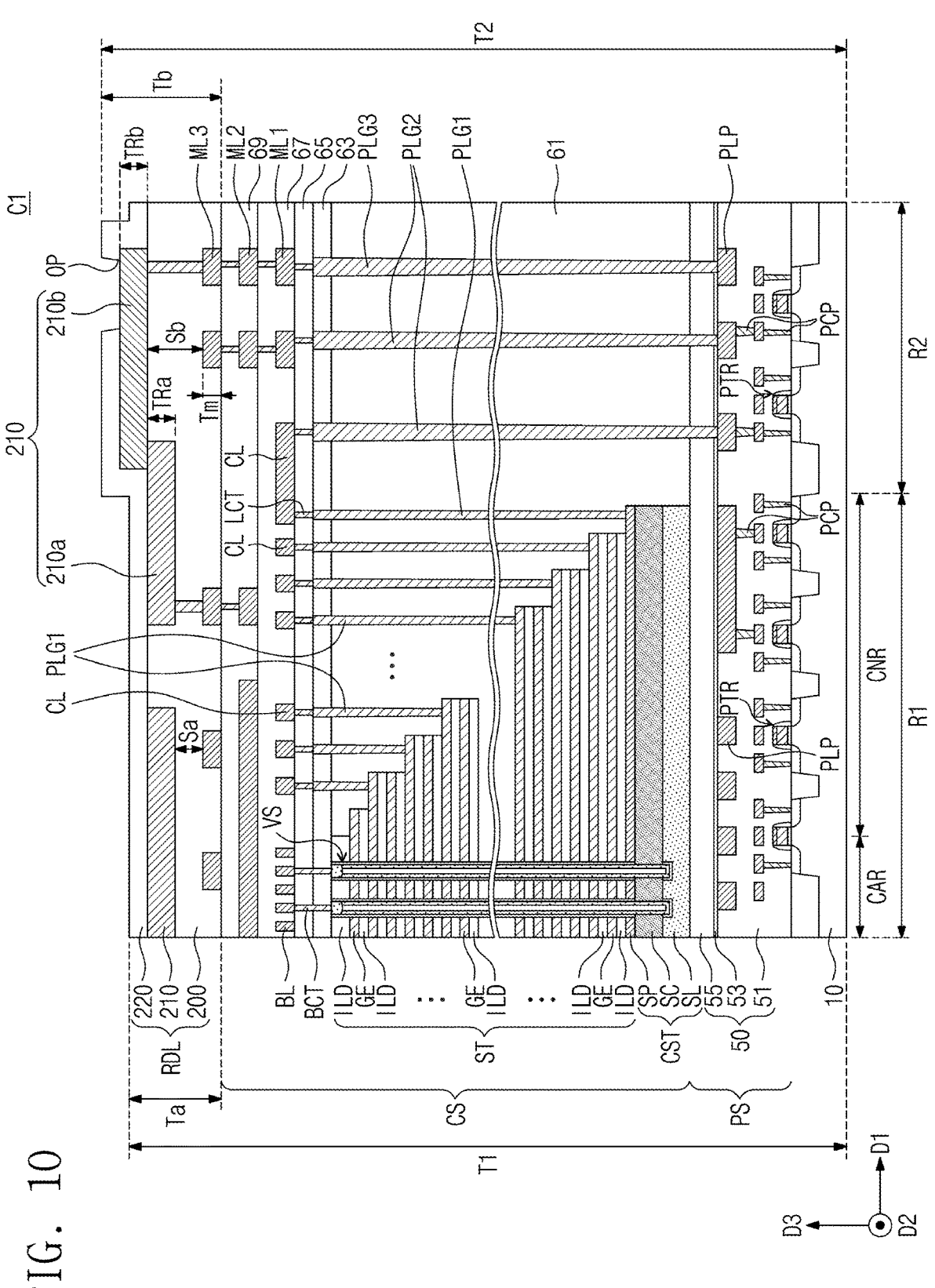

According to the embodiment of FIG. 10, the redistribution pattern 210 may include a line portion 210a disposed on the stack region R1 and a pad portion 210b provided on the pad region R2, and a thickness TRb of the pad portion 210b may be substantially the same as a thickness TRa of the line portion 210a. The thickness TRa of the line portion 210a and the thickness TRb of the pad portion 210b may be greater than a thickness Tm of the third metal line ML3. For example, the line portion 210a and the pad portion 210b of the redistribution pattern 210 may include or be formed of different metallic materials from each other.

On the pad region R2, a top surface of the redistribution dielectric layer 200 may be located at a substantially the same as that of a top surface at the line portion 210a of the redistribution pattern 210.

An interval Sa between the third metal line ML3 and the redistribution pattern 210 on the stack region R1 may be less than an interval Sb between the third metal line ML3 and the redistribution pattern 210 on the pad region R2. On the pad region R2, the interval Sb between the third metal line ML3 and the redistribution pattern 210 may be greater than an interval between the second metal line ML2 and the third metal line ML3.

Figure 11:
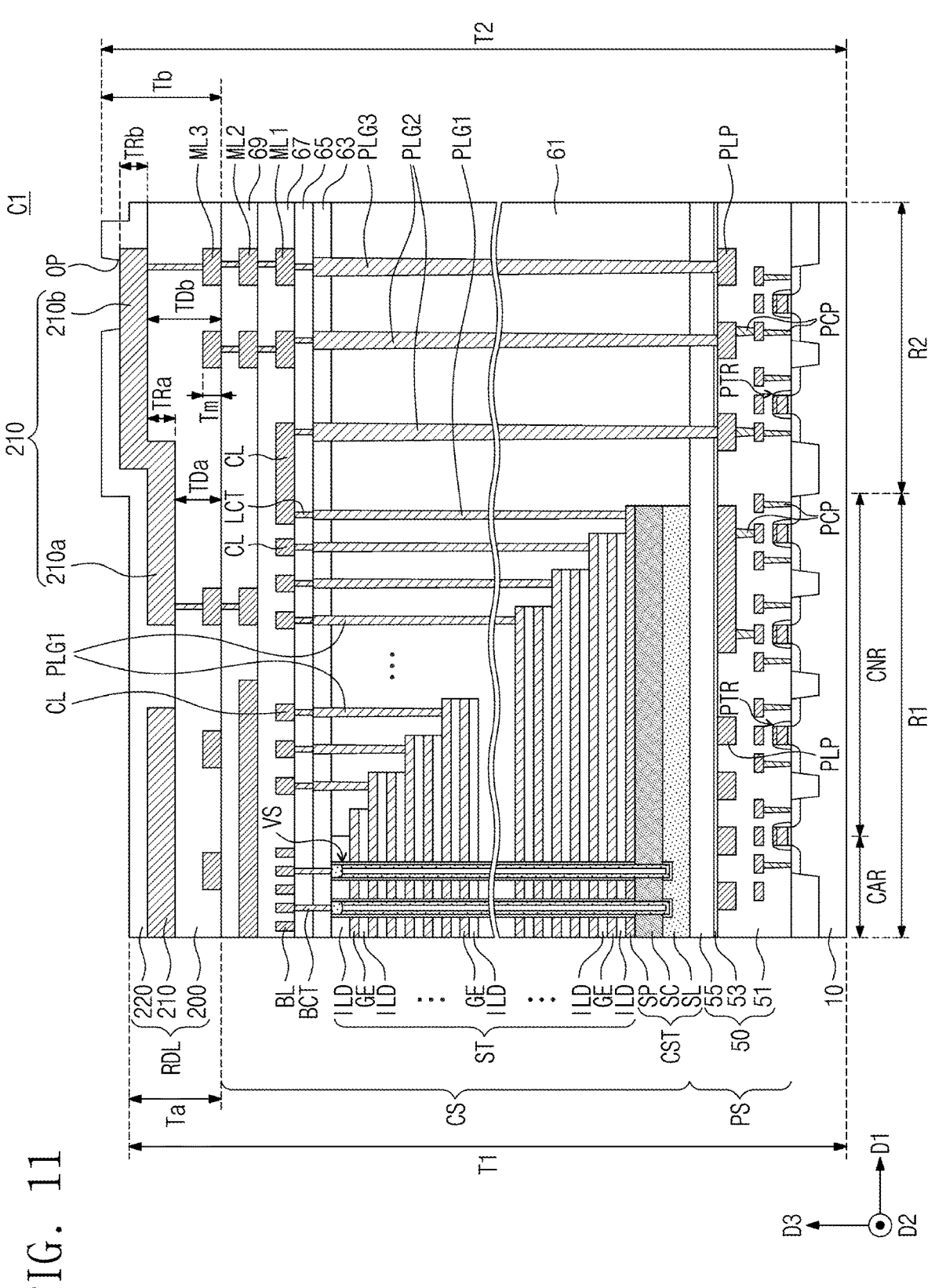

According to the embodiment of FIG. 11, a thickness TDa of the redistribution dielectric layer 200 on the stack region R1 may be less than a thickness TDb of the redistribution dielectric layer 200 on the pad region R2. A top surface of the redistribution dielectric layer 200 on the stack region R1 may be located at a lower level than that of a top surface of the redistribution dielectric layer 200.

A thickness TRa of the redistribution pattern 210 on the stack region R1 may be substantially the same at a thickness TRb of the redistribution pattern 210 on the pad region R2 (e.g., other than at a boundary between the stack region R1 and the pad region R2), and a top surface of the redistribution pattern 210 on the stack region R1 may be lower than a top surface of the redistribution pattern 210 on the pad region R2.

Figure 12:
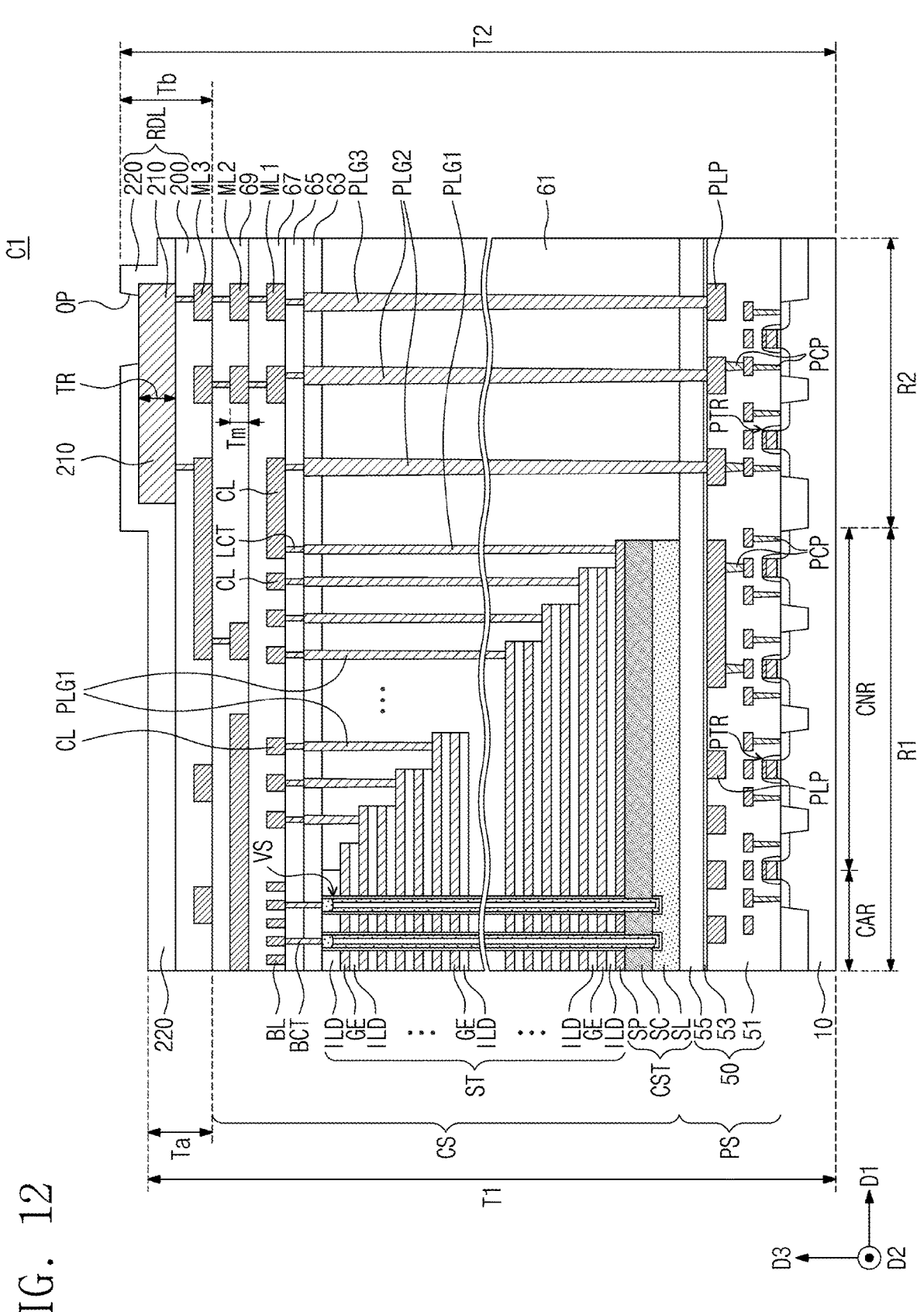

According to the embodiment shown in FIG. 12, the redistribution layer RDL may be disposed on the fourth interlayer dielectric layer 69, and the redistribution pattern 210 may be omitted on the stack region R1 and may be provided only on the pad region R2. On the pad region R2, a portion of the redistribution pattern 210 may be exposed by the opening OP of the passivation layer 220. On the pad region R2, the redistribution pattern 210 may be connected through vias to the third metal lines ML3.

Figure 13:
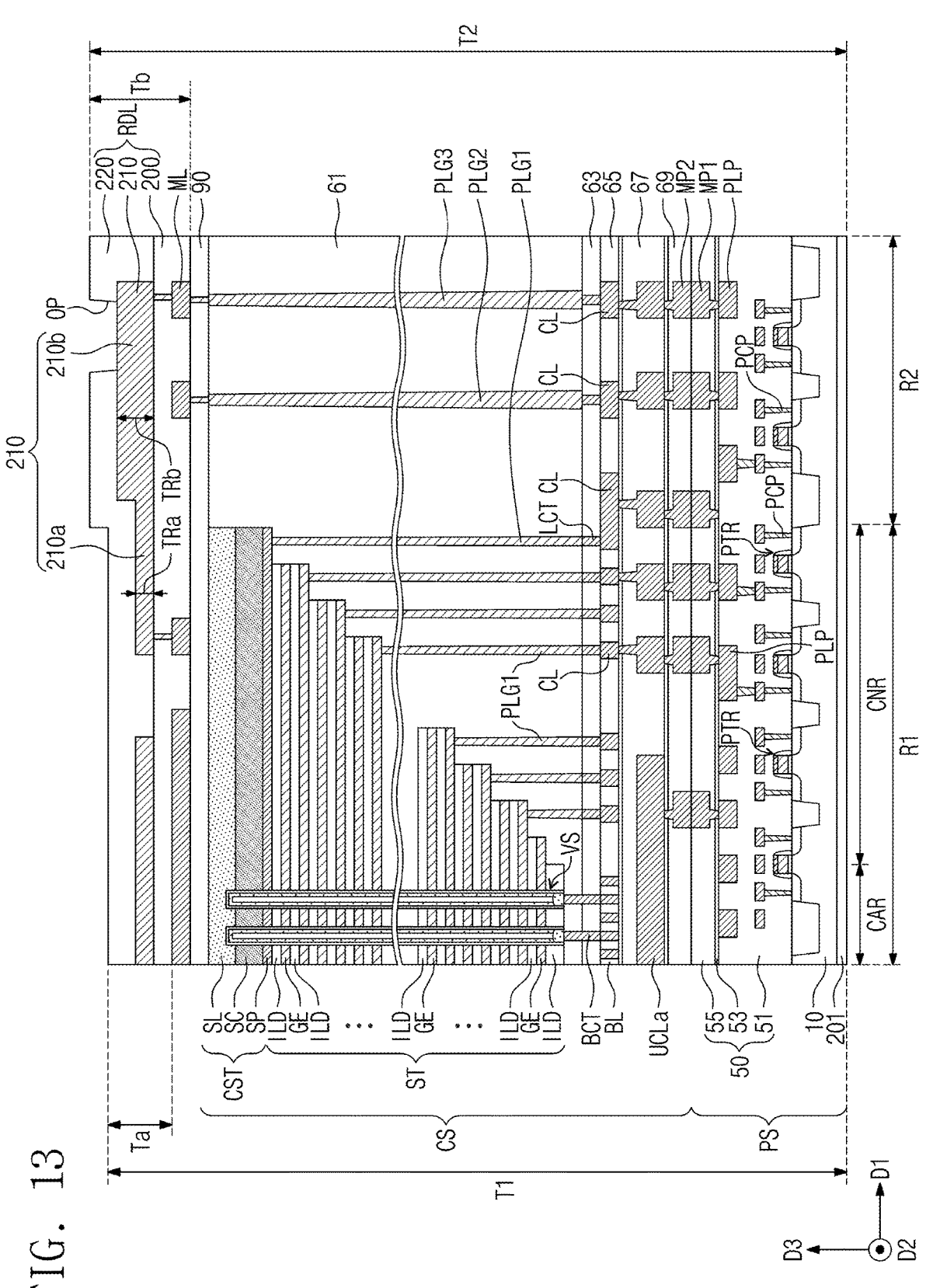
Figure 14:
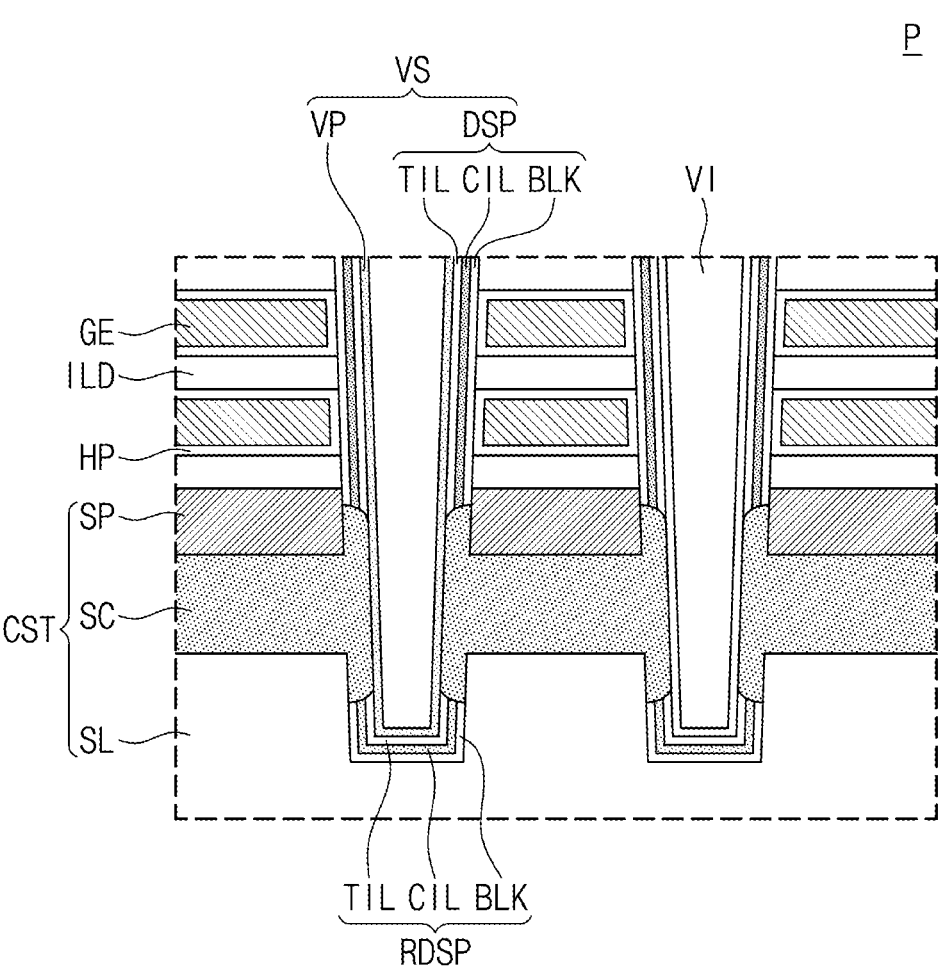
FIG. 14 illustrates an enlarged view showing section P2 of FIG. 9.

A semiconductor device according to the embodiment shown in FIG. 13 may have a chip-to-chip (C2C) structure. The C2C structure may be achieved by manufacturing an upper chip that includes a peripheral circuit structure PS on a first semiconductor substrate 10 (or first wafer), manufacturing a lower chip that includes a cell array structure CS on a second semiconductor substrate (or second wafer) different from the first semiconductor substrate 10, and then using a bonding method to connect the upper chip and the lower chip to each other. The bonding method may mean a way in which a bonding metal pad formed on an uppermost metal layer of the upper chip (e.g., after the chip is flipped over) is electrically connected to a bonding metal pad formed on an uppermost metal layer of the lower chip. For example, when the bonding metal pad is formed of copper (Cu), the bonding method may be a Cu-to-Cu bonding method and the bonding metal pad may be formed of aluminum (Al) or tungsten (W).

The peripheral circuit structure PS may be formed on the first semiconductor substrate 10, and as discussed above with reference to FIGS. 9 to 12, may include peripheral circuits PTR, peripheral contact plugs PCP, peripheral circuit lines PLP, and a peripheral circuit dielectric layer 50. The peripheral circuits PTR may be integrated on a top surface of the first semiconductor substrate 10. A surface dielectric layer 201 may be provided on a rear surface of the first semiconductor substrate 10. The peripheral circuit structure PS may have features substantially the same as those of the examples discussed above.

According to some embodiments, the peripheral circuit structure PS may further include first bonding pads MP1 provided in au uppermost peripheral circuit dielectric layer 50. The first bonding pads MP1 may be electrically connected to the peripheral circuits PTR through the peripheral circuit lines PLP and the peripheral contact plugs PCP. The first bonding pads MP1 may have their top surfaces substantially coplanar with that of the uppermost peripheral circuit dielectric layer 50.

As discussed with reference to FIGS. 9 to 12, the cell array structure CS may include a source structure CST, a stack structure ST, vertical structures VS, bit lines BL, connection lines CL, and contact plugs PLG1, PLG2, and PLG3, and these components may have features substantially the same as those discussed above in the previous embodiments.

In addition, the cell array structure CS may include second bonding pads MP2 that electrically connect the bit lines BL to the electrodes GE (or word lines). The second bonding pads MP2 may be provided in an uppermost interlayer dielectric layer 69 of the interlayer dielectric layers 63, 65, 67, and 69. On the pad region R2, some of the second bonding pads MP2 may be electrically connected to the second and third contact plugs PLG2 and PLG3 through the connection lines CL and the connection contact plugs LCT.

The second bonding pads MP2 may be electrically and physically bonded to the first bonding pads MP1 of the peripheral circuit structure PS. For example, the second bonding pads BP2 may contact the first bonding pads BP1.

The second bonding pads MP2 may include the same metallic material as that of the first bonding pads MP1. The second bonding pads MP2 and the first bonding pads MP1 may be substantially the same as each other in terms of arrangement, shape, width, and area.

According to the present embodiment, a lower dielectric layer 90 may be disposed on the semiconductor layer SL of the source structure CST, and metal lines ML may be provided on the lower dielectric layer 90. On the pad region R2, the metal line ML may be electrically connected through a contact plug to one of the second and third contact plugs PLG2 and PLG3.

A redistribution layer RDL may be provided on the lower dielectric layer 90, and a redistribution dielectric layer 200 may cover the metal lines ML. For example, the redistribution dielectric layer 200 may have a substantially uniform thickness on the stack region R1 and the pad region R2.

As discussed with reference to FIG. 9, a redistribution pattern 210 may be disposed on the redistribution dielectric layer 200, and a thickness TRa of the redistribution pattern 210 on the stack region R1 may be less than a thickness TRb of the redistribution pattern 210 on the pad region R2.

A passivation layer 220 may have a substantially uniform thickness on the stack region R1 and the pad region R2 (e.g., other than at a boundary where the two regions meet), and may cover a top surface of the redistribution dielectric layer 200 and a top surface of the redistribution pattern 210. The passivation layer 220 may have an opening OP that exposes a pad portion 210b of the redistribution pattern 210.

The redistribution layer RDL shown in FIG. 13 may have features of the redistribution layer RDL discussed with reference to any of FIGS. 10 to 12.

Figure 15A:
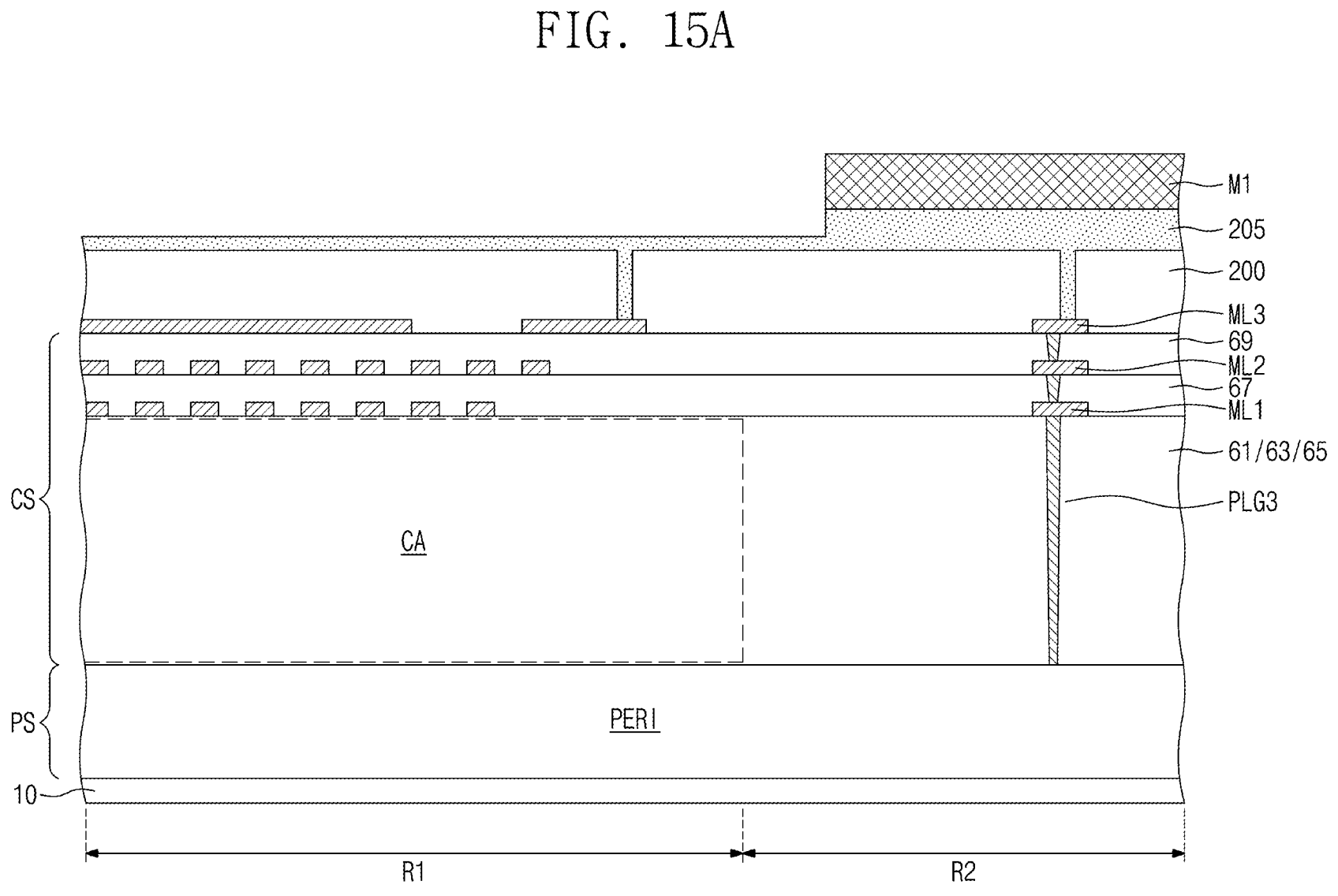
Figure 15B:
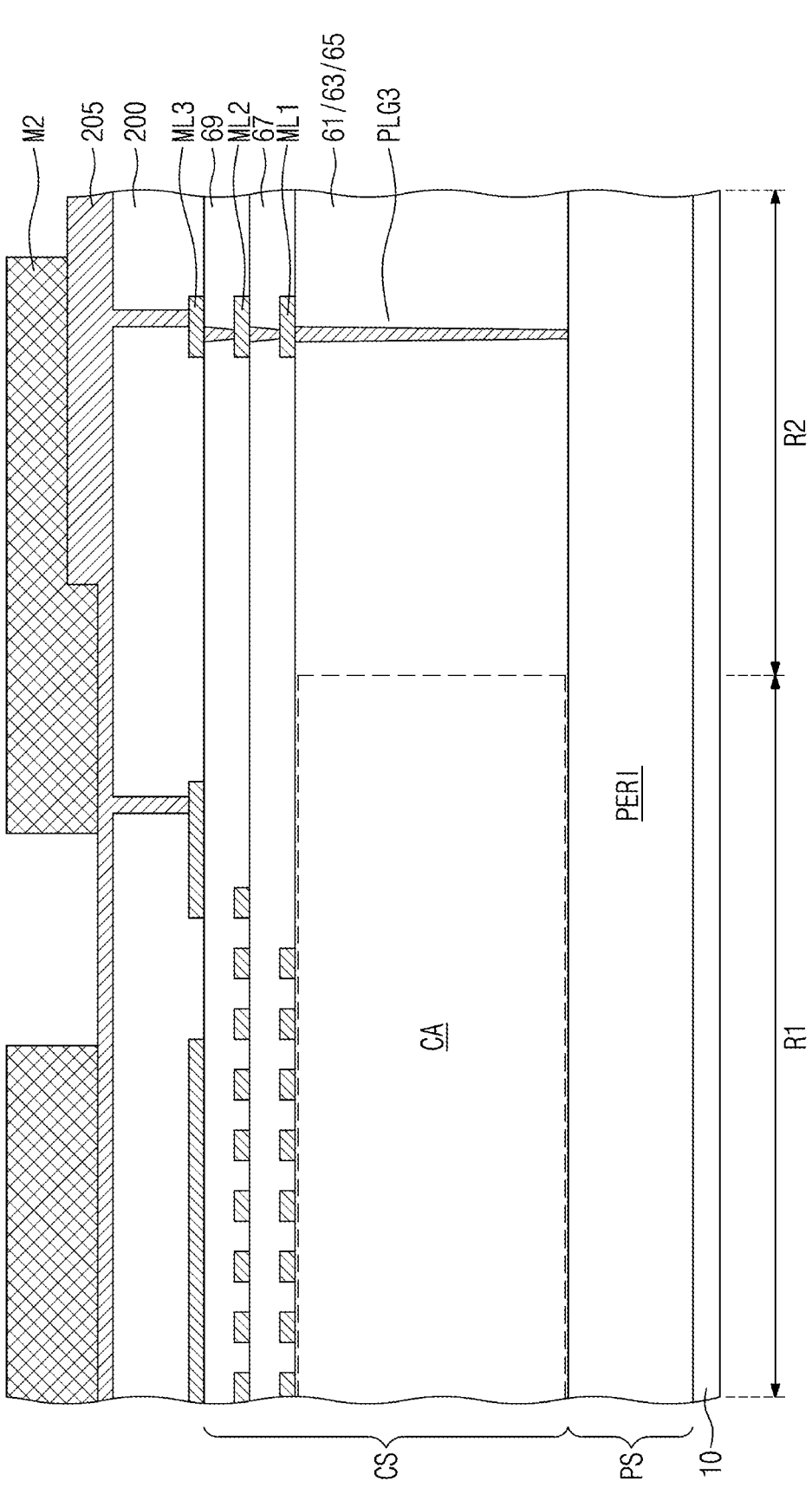
Figure 15C:
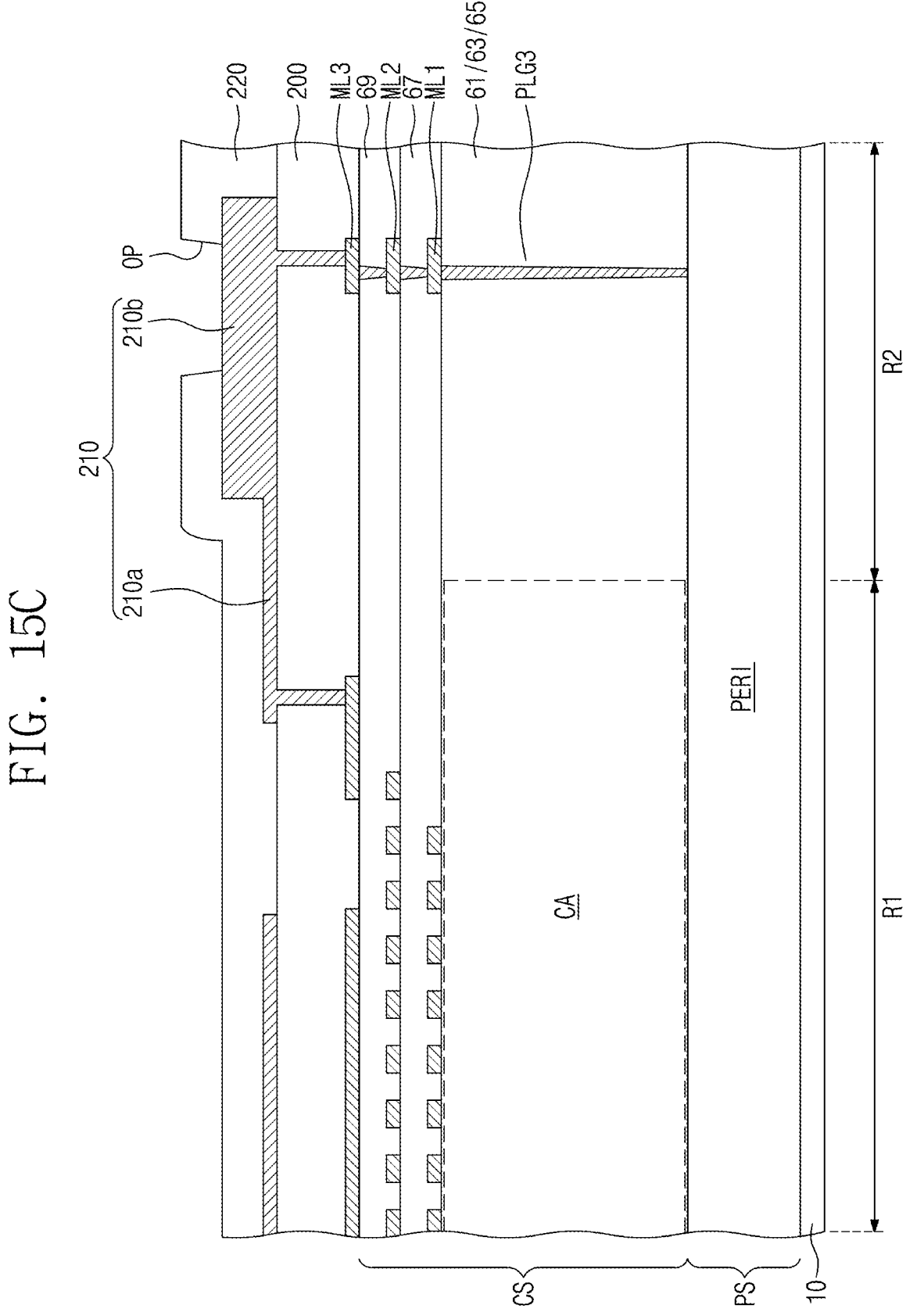

FIGS. 15A, 15B, and 15C illustrate cross-sectional views showing a method of fabricating a semiconductor device according to some embodiments of the present inventive concepts.

Referring to FIG. 15A, a semiconductor substrate 10 may include a stack region R1 and a pad region R2.

A peripheral circuit structure PS may be disposed on the semiconductor substrate 10. The peripheral circuit structure PS may include a peripheral circuit PERI formed on the semiconductor substrate 10. The peripheral circuit structure PS may include components substantially the same as those of the peripheral circuit structure PS discussed above with reference to FIGS. 9 to 13.

For example, the formation of the peripheral circuit structure PS may include forming peripheral circuits (see PTR of FIG. 9) on the semiconductor substrate 10, forming peripheral line structures (see PCP and PLP of FIG. 9) connected to the peripheral circuits PTR, and forming a peripheral circuit dielectric layer (see 50 of FIG. 9).

A cell array structure CS may be formed on the peripheral circuit structure PS. The cell array structure CS may include a cell array CA on the stack region R1 and a plurality of dielectric layers 61/63/65 on the pad region R2. The cell array structure CS may include components substantially the same as those of the cell array structure CS discussed above with reference to FIGS. 9 to 13.

For example, the formation of the cell array structure CS may include forming a source structure (see CST of FIG. 9) on the peripheral circuit structure PS on the stack region R1, forming on the source structure CST a stack structure (see ST of FIG. 9) including electrodes (see GE of FIG. 9) and dielectric layers (see ILD of FIG. 9) that are vertically alternately stacked, forming vertical structures (see VS of FIG. 9) that penetrate the stack structure ST, forming a planarized dielectric layer (see 61 of FIG. 9) that covers the stack structure ST on the peripheral circuit structure PS, and forming multiple dielectric layers 63/65/67 and first, second, and third metal lines ML1, ML2, and ML3 of the stack structure ST and the planarized dielectric layer 61.

After the formation of uppermost metal lines or the third metal lines ML3, a redistribution conductive layer 205 may be formed on a dielectric layer 200 formed on an uppermost interlayer dielectric layer 69. The redistribution conductive layer 205 may fill a via hole that penetrates the dielectric layer 200 formed on the uppermost interlayer dielectric layer 69.

The formation of the redistribution conductive layer 205 may include forming a metal seed layer that conformally covers a surface of a dielectric layer 200, and forming a metal layer on the metal seed layer. The metal seed layer and the metal layer may be formed by a film deposition method such as electroplating, electroless plating, or sputtering. The redistribution conductive layer 205 may include or be formed of, for example, at least one selected from copper (Cu), aluminum (Al), nickel (Ni), silver (Ag), gold (Au), platinum (Pt), tin (Sn), lead (Pb), titanium (Ti), chromium (Cr), palladium (Pd), indium (In), zinc (Zn), carbon (C), and an alloy thereof. In some embodiments, the redistribution conductive layer 205 may include a different metallic material from that of the first, second, and third metal lines ML1, ML2, and ML3. For example, the first, second, and third metal lines ML1, ML2, and ML3 may include tungsten (W) or copper (Cu), and the redistribution conductive layer 205 may include aluminum (Al).

The redistribution conductive layer 205 may be electrically connected to the third metal lines ML3. The redistribution conductive layer 205 may have a substantially uniform thickness on the dielectric layer 200.

After the formation of the redistribution conductive layer 205, a first mask pattern M1 may be formed on the redistribution conductive layer 205. The first mask pattern M1 may cover a top surface of the redistribution conductive layer 205 on the pad region R2. Afterwards, the first mask pattern M1 may be used as an etching mask to anisotropically etch a portion of the redistribution conductive layer 205. Therefore, the redistribution conductive layer 205 may have a thickness that is less on the stack R1 than on the pad region R2. The redistribution conductive layer 205 prior to the etching may be described as a preliminary redistribution conductive layer.

Referring to FIG. 15B, a second mask pattern M2 may be formed on the redistribution conductive layer 205. The second mask pattern M2 may cover portions of the redistribution conductive layer 205 on the stack region R1 and pad region R2.

Referring to FIG. 15C, the second mask pattern M2 may be used as an etching mask to etch the redistribution conductive layer 205 to expose the redistribution dielectric layer 200. Thus, as discussed above with reference to FIG. 9, a redistribution pattern 210 may be formed which has a first thickness on the stack region R1 and a second thickness on the pad region R2, which second thickness is greater than the first thickness.

After that, a passivation layer 220 may be formed on the redistribution dielectric layer 200 and the redistribution pattern 210. The passivation layer 220 may include or may be, for example, a silicon oxide layer, a silicon nitride layer, a silicon oxynitride layer, or a polyimide-based material.

The passivation layer 220 may be formed of photosensitive polyimide, and in this case, a spin coating process may be employed to deposit the passivation layer 220 on the redistribution dielectric layer 200. The passivation layer 220 may be formed to have a substantially uniform thickness on the stack region R1 and the pad region R2. Then, the passivation layer 220 may be patterned by an exposure process without forming a photoresist layer. For example, on the pad region R2, a pad portion 210b of the redistribution pattern 210 may be partially exposed by an opening OP of the passivation layer 220.

A semiconductor chip formed in such way may have a thickness that is greater than on the pad region R2 than on the stack region R1, as discussed above.

Figure 16A:
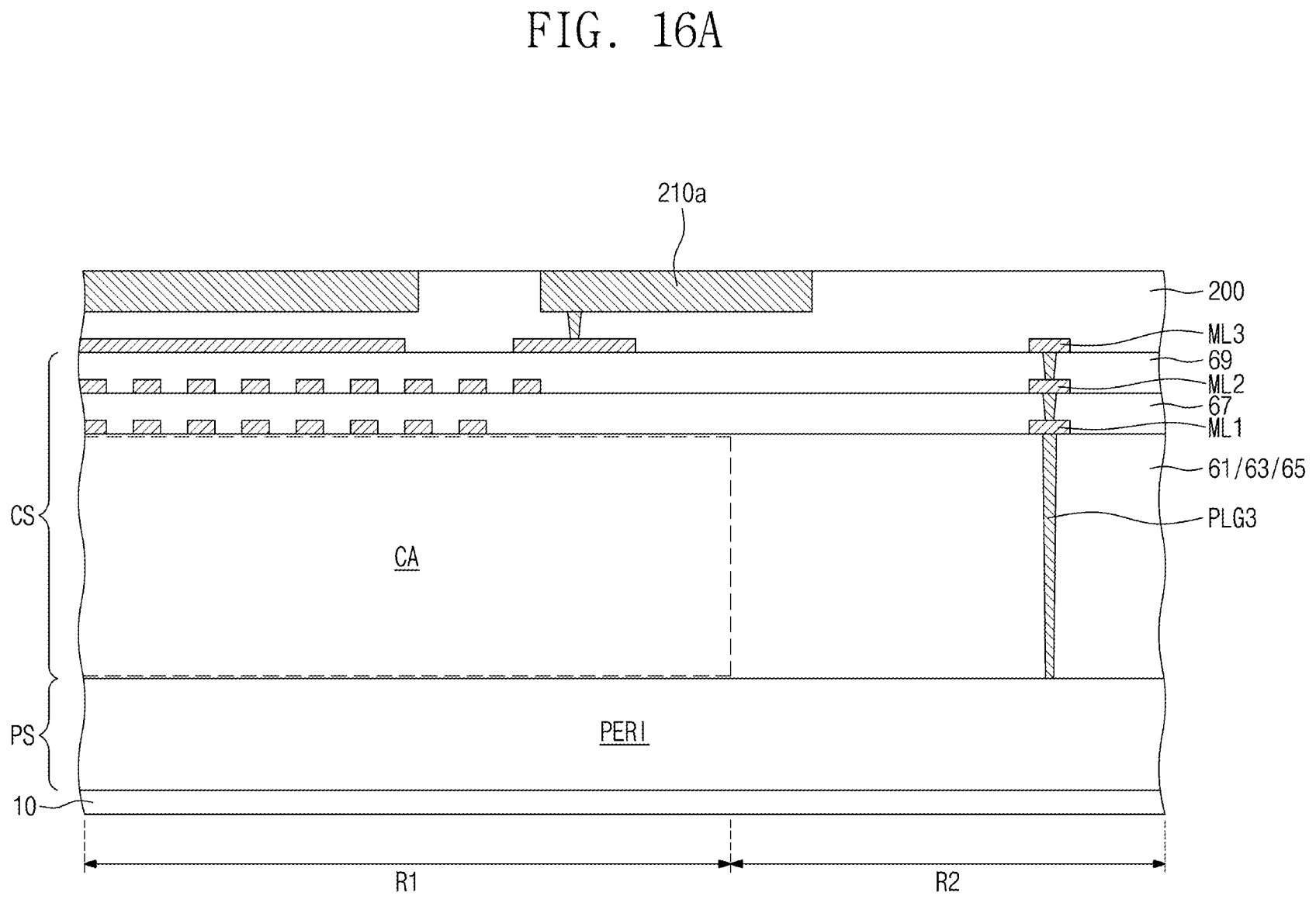
Figure 16B:
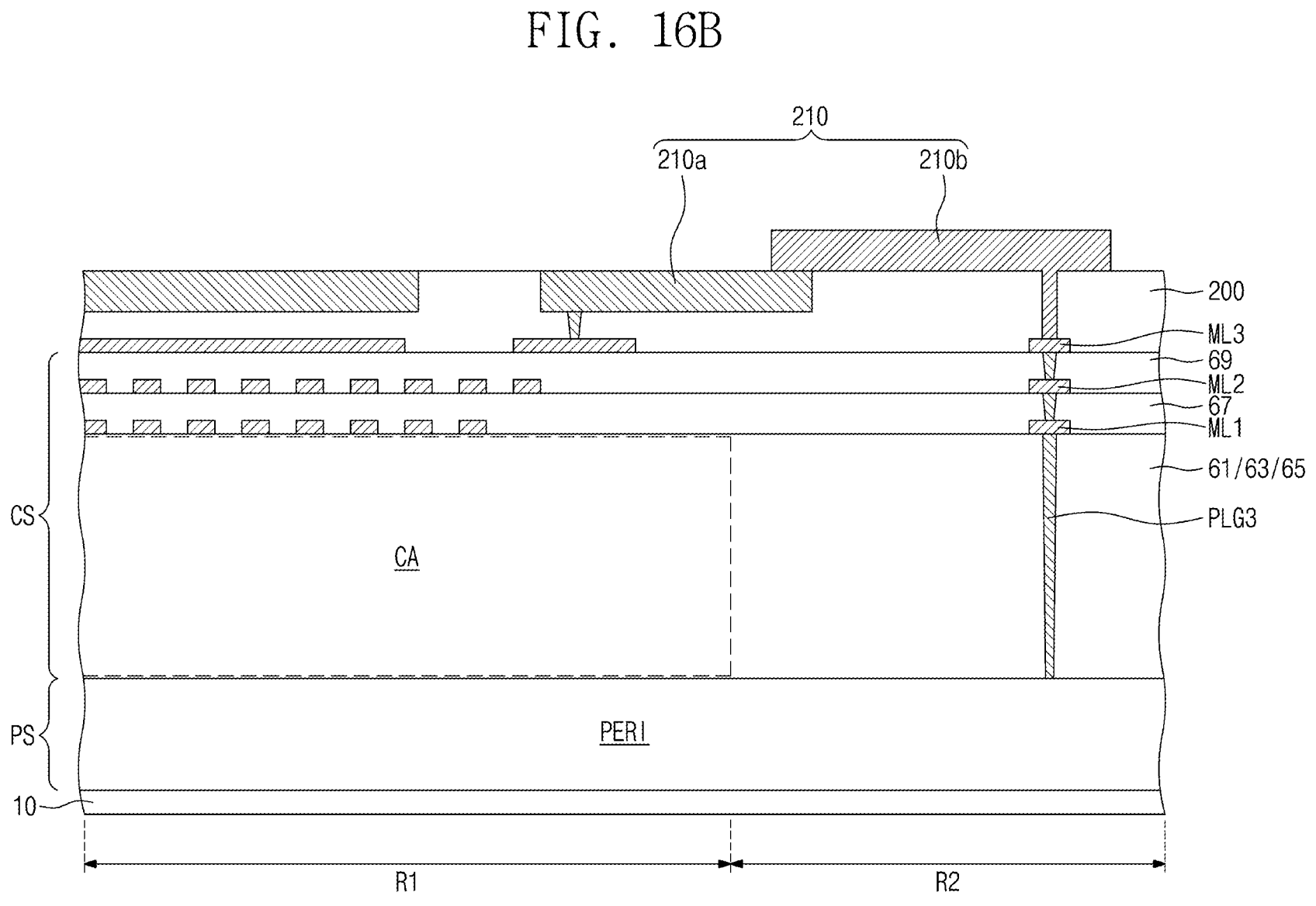
Figure 16C:
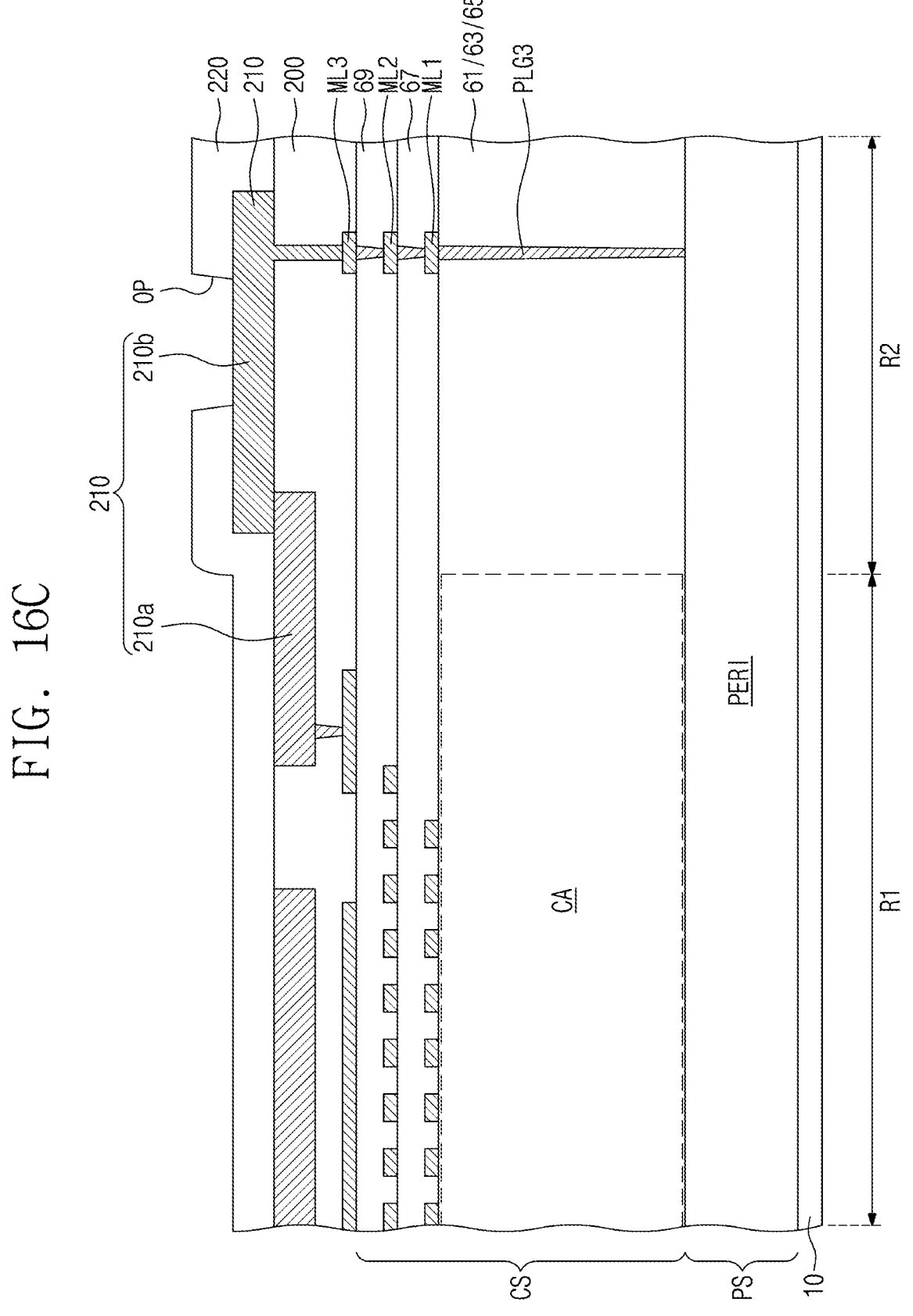

FIGS. 16A, 16B, and 16C illustrate cross-sectional views showing a method of fabricating a semiconductor device according to some embodiments of the present inventive concepts.

Referring to FIG. 16A, as discussed with reference to FIG. 15A, a peripheral circuit structure PS may be formed on the semiconductor substrate 10, and then a cell array structure CS may be formed on the peripheral circuit structure PS.

A redistribution dielectric layer 200 may be formed on the uppermost interlayer dielectric layer 69 of the cell array structure CS, covering the third metal lines ML3.

On the stack region R1, a line portion 210a of the redistribution pattern 210 may be formed in the redistribution dielectric layer 200. The line portion 210a of the redistribution pattern 210 may be connected through a via to the third metal line ML3. The line portion 210a of the redistribution pattern 210 may be formed by forming a trench by etching a portion of the redistribution dielectric layer 200 on the stack region R1, filling the trench with a first metallic material, and then planarizing the first metallic material. Therefore, the line portion 210a of the redistribution pattern 210 may have a top surface substantially coplanar with that of the redistribution dielectric layer 200. The line portion 210a of the redistribution pattern 210 may have a thickness the same as or greater than those of the third metal lines ML3.

Referring to FIG. 16B, on the pad region R2, a pad portion 210b of the redistribution pattern 210 may be formed on the redistribution dielectric layer 200 and a via hole may be formed through the redistribution dielectric layer 200 on the pad region R2. The pad portion 210b may be formed by depositing on the redistribution dielectric layer 200 a second metallic material different from the first metallic material, and then patterning the deposited second metallic material. The pad portion 210b may partly contact the top surface of the line portion 210a, and may be connected to the third contact plug PLG3 through the first, second, and third metal lines ML1, ML2, and ML3.

Referring to FIG. 16C, as discussed with reference to FIG. 15C, a passivation layer 220 may be formed on the redistribution dielectric layer 200 and the redistribution pattern 210. The passivation layer 220 may be formed to have a substantially uniform thickness on the stack region R1 and the pad region R2.

On the pad region R2, the passivation layer 220 may be patterned to form an opening OP that partially exposes the pad portion 210b of the redistribution pattern 210.

Figure 17A:
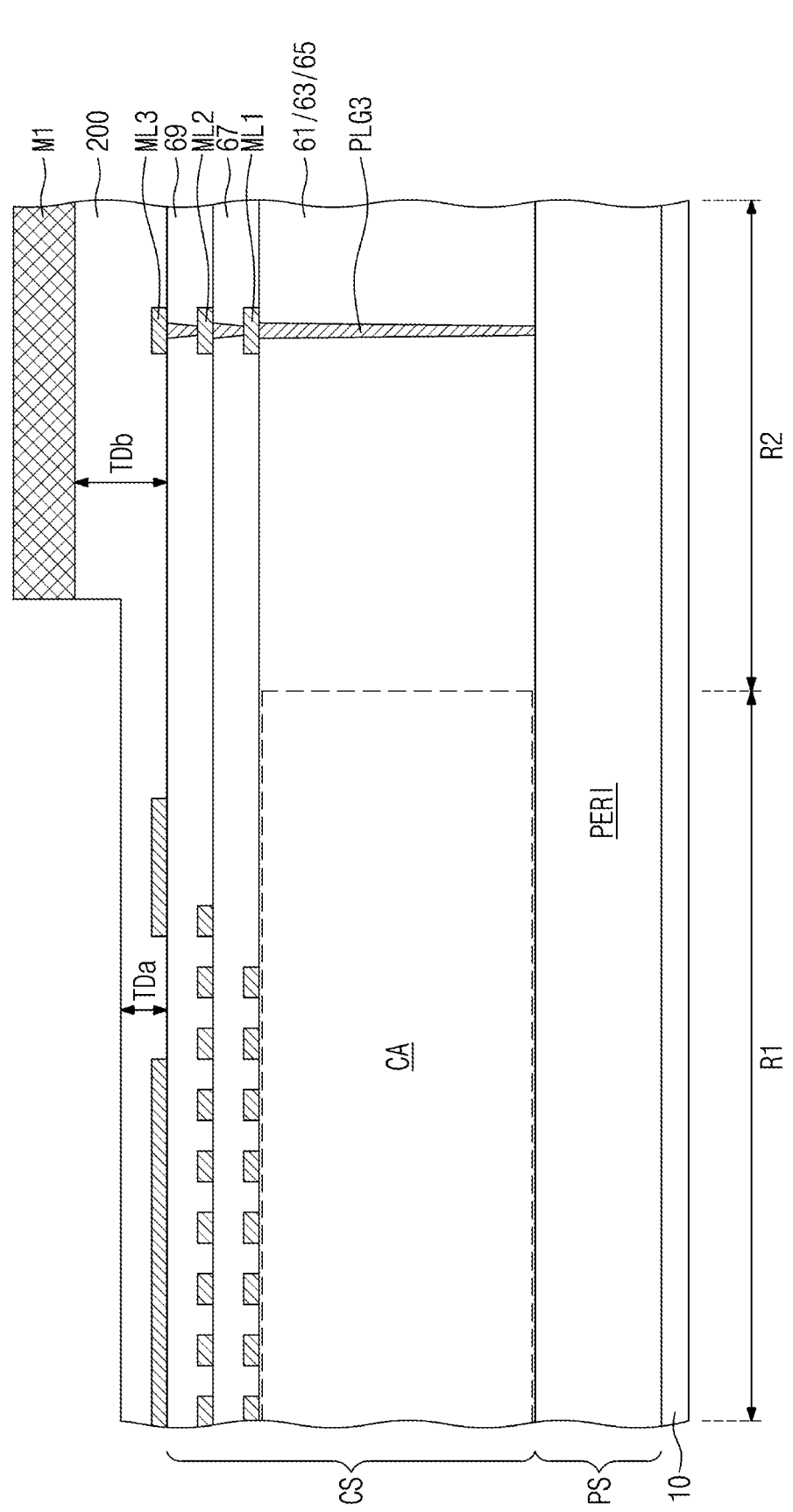
Figure 17B:
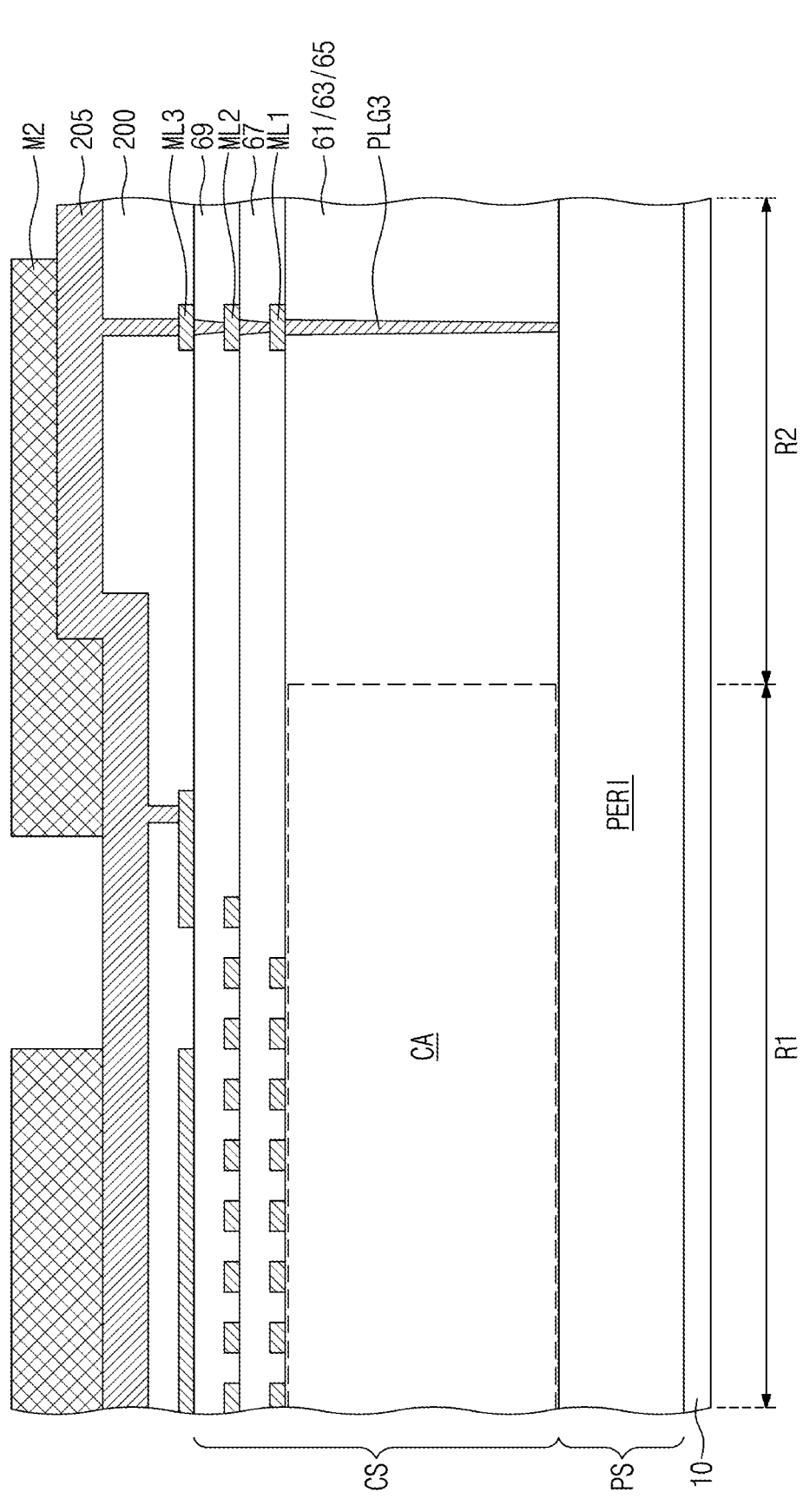
Figure 17C:
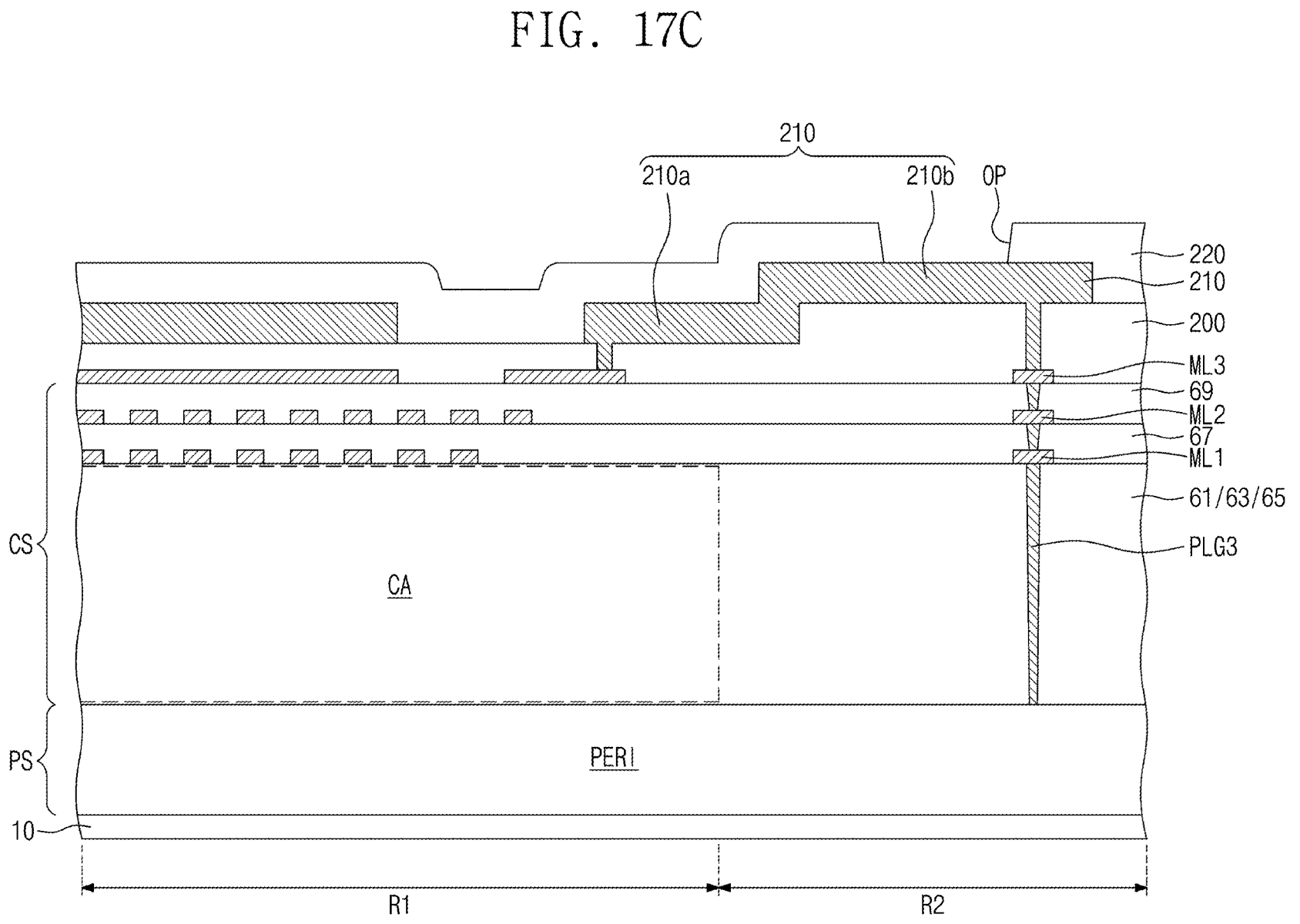

FIGS. 17A, 17B, and 17C illustrate cross-sectional views showing a method of fabricating a semiconductor device according to some embodiments of the present inventive concepts.

Referring to FIG. 17A, as discussed with reference to FIG. 15A, a peripheral circuit structure PS may be formed on the semiconductor substrate 10, and then a cell array structure CS may be formed on the peripheral circuit structure PS. Afterwards, a redistribution dielectric layer 200 may be formed on the uppermost interlayer dielectric layer 69 of the cell array structure CS, covering the third metal lines ML3.

After the formation of the redistribution dielectric layer 200, a first mask pattern M1 may be formed on the redistribution dielectric layer 200. The first mask pattern M1 may cover a top surface of the redistribution dielectric layer 200 on the pad region R2. Thereafter, the first mask pattern M1 may be used as an etching mask to anisotropically etch a portion of the redistribution dielectric layer 200. Therefore, a thickness TDa of the redistribution dielectric layer 200 on the stack region R1 may be less than a thickness TDb of the redistribution dielectric layer 200 on the pad region R2.

According to some embodiments, before the first mask pattern M1 is used to form the redistribution dielectric layer 200, via holes (not shown) may be formed to penetrate the redistribution dielectric layer 200.

Referring to FIG. 17B, a redistribution conductive layer 205 may be formed on the redistribution dielectric layer 200. The redistribution conductive layer 205 may fill via holes that penetrate the uppermost interlayer dielectric layer 69.

The formation of the redistribution conductive layer 205 may include forming a metal seed layer that conformally covers a surface of the redistribution dielectric layer 200, and forming a metal layer on the metal seed layer. The metal seed layer and the metal layer may be formed by a film deposition method such as electroplating, electroless plating, or sputtering. The redistribution conductive layer 205 may have a substantially uniform thickness on the stack region R1 and the pad region R2.

A second mask pattern M2 may be formed on the redistribution conductive layer 205. The second mask pattern M2 may cover portions of the redistribution conductive layer 205 on the stack region R1 and pad region R2.

Referring to FIG. 17C, the second mask pattern M2 may be used as an etching mask to etch the redistribution conductive layer 205 to expose the redistribution dielectric layer 200. Therefore, as discussed above with reference to FIG. 11, a redistribution pattern 210 may be formed to have a step difference between the stack region R1 and the pad region R2.

Thereafter, as discussed with reference to FIG. 15C, a passivation layer 220 may be formed on the redistribution dielectric layer 200 and the redistribution pattern 210. The passivation layer 220 may be formed to have a substantially uniform thickness on the stack region R1 and the pad region R2.

On the pad region R2, the passivation layer 220 may be patterned to form an opening OP that partially exposes the pad portion 210b of the redistribution pattern 210.

Figure 18A:
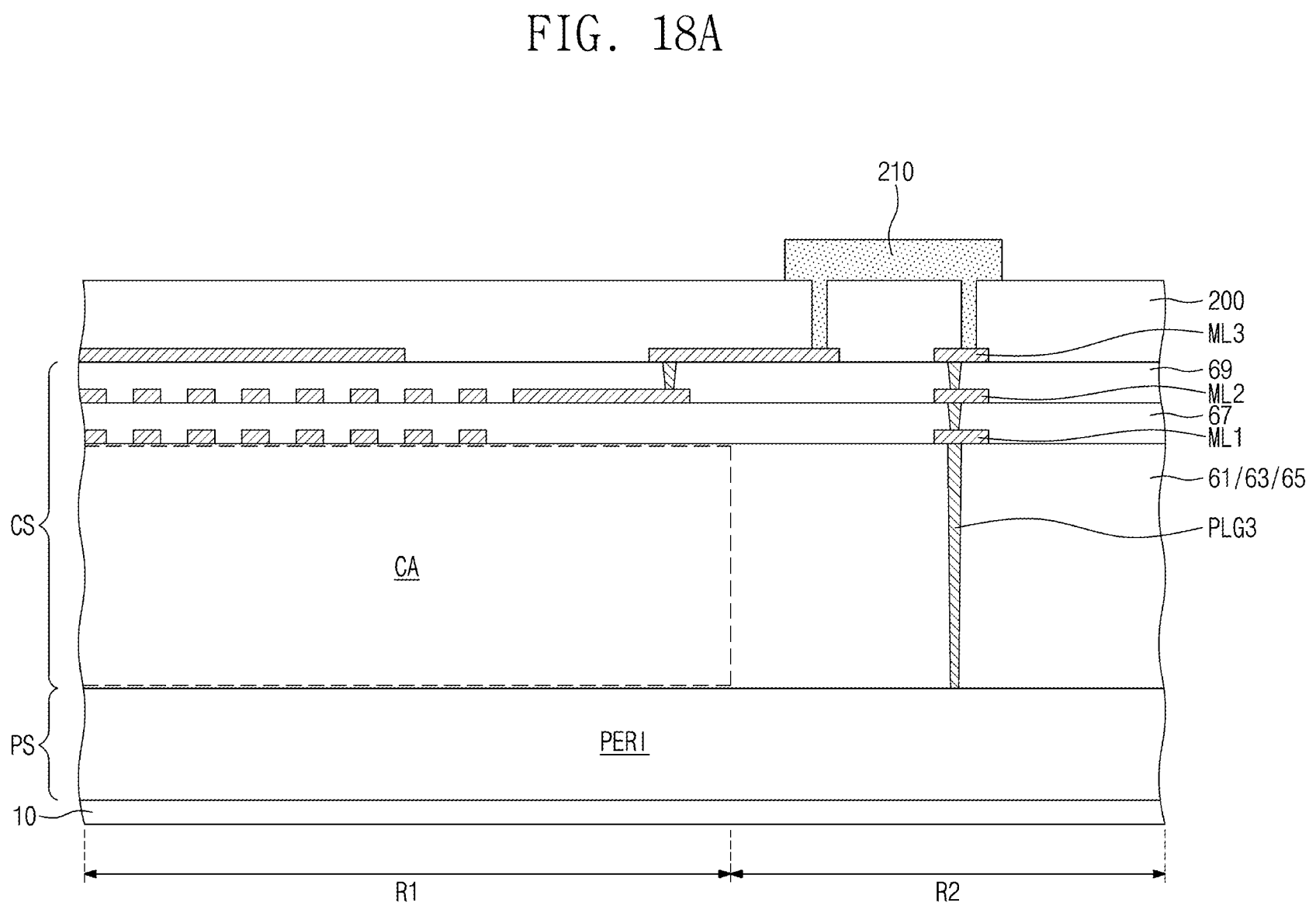
Figure 18B:
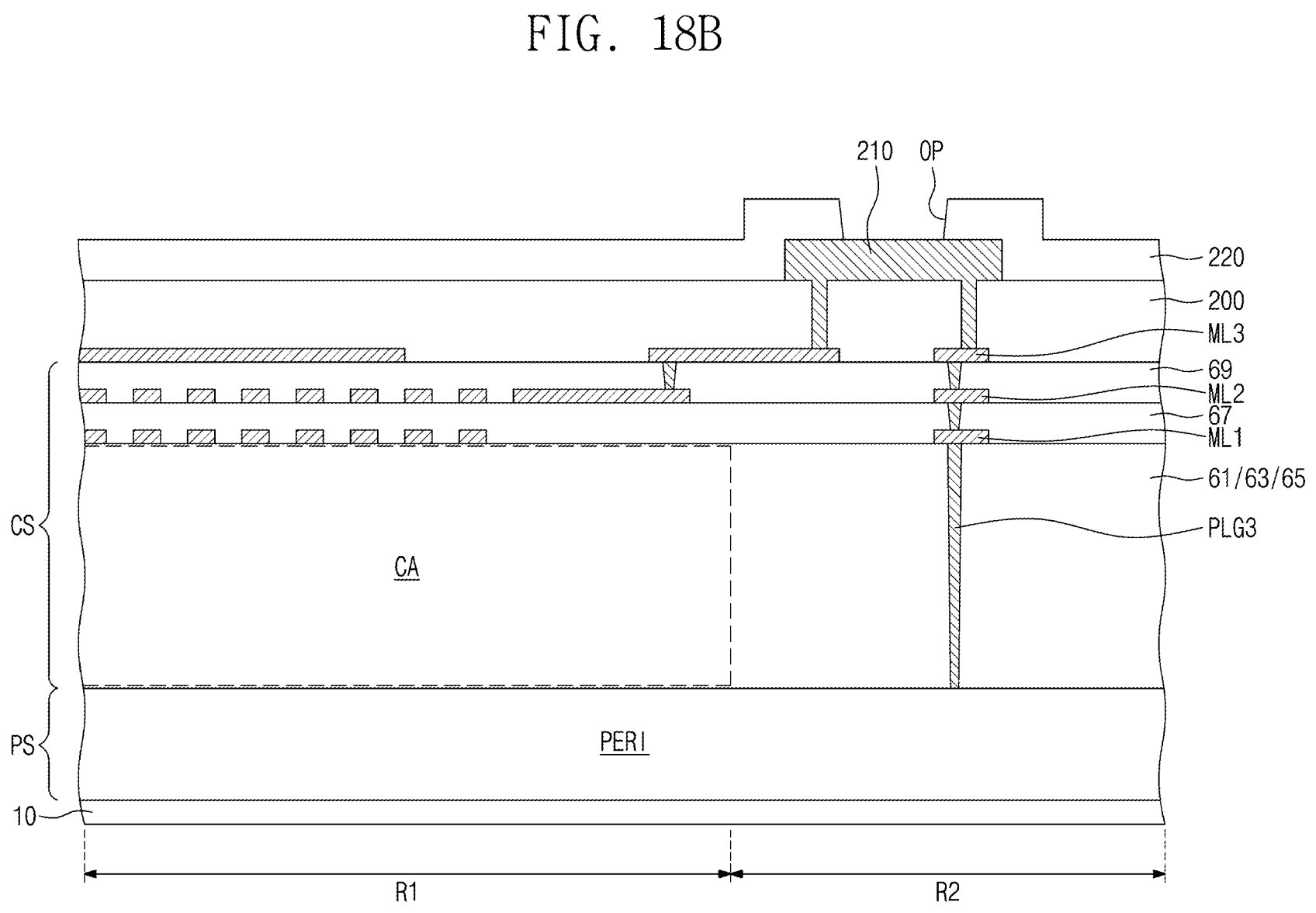

FIGS. 18A and 18B illustrate cross-sectional views showing a method of fabricating a semiconductor device according to some embodiments of the present inventive concepts.

Referring to FIG. 18A, as discussed with reference to FIG. 15A, a peripheral circuit structure PS may be formed on the semiconductor substrate 10, and then a cell array structure CS may be formed on the peripheral circuit structure PS. Afterwards, a redistribution dielectric layer 200 may be formed on the uppermost interlayer dielectric layer 69 of the cell array structure CS, covering the third metal lines ML3.

On the pad region R2, via holes (not shown) may be formed to penetrate the redistribution dielectric layer 200.

After the formation of the via holes (not shown), a redistribution pattern 210 may be locally formed on the redistribution dielectric layer 200 on only the pad region R2. The redistribution pattern 210 may be formed by depositing a redistribution conductive layer on the redistribution dielectric layer 200, and then patterning the redistribution conductive layer. When the redistribution conductive layer is patterned, the redistribution conductive layer may be removed on the stack region R1.

Referring to FIG. 18B, as discussed with reference to FIG. 15C, a passivation layer 220 may be formed on the redistribution dielectric layer 200 and the redistribution pattern 210.

According to some embodiments of the present inventive concepts, a redistribution pattern may have a pad portion to which a bonding wire is bonded, and the pad portion of the redistribution pattern may be formed on a pad region of a semiconductor chip, with the result that it may be possible to easily change a pad size and position. In addition, a conductive pattern connected to a cell array and a peripheral circuit may be disposed below the pad portion of the redistribution pattern, and thus an area of the pad region may be reduced to decrease a size of the semiconductor chip.

According to some embodiments of the present inventive concepts, a redistribution layer on top of a semiconductor chip may be formed to have different thicknesses on a stack region and a pad region, and therefore it may be possible to reduce a size of a semiconductor package including semiconductor chips stacked on a package substrate.

Although the present inventive concepts have been described in connection with some embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts.

Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

What is claimed is:

1. A semiconductor device, comprising:
a semiconductor substrate that includes a stack region and a pad region;
a peripheral circuit structure that includes a plurality of peripheral circuits on the semiconductor substrate;
a cell array structure on the peripheral circuit structure; and
a redistribution layer on the cell array structure, the redistribution layer including a redistribution dielectric layer and a redistribution pattern on the redistribution dielectric layer, the redistribution dielectric layer covering an uppermost conductive pattern of the cell array structure, and the redistribution pattern being connected to the uppermost conductive pattern, wherein a thickness in a vertical direction of the redistribution layer on the pad region is greater than a thickness in the vertical direction of the redistribution layer on the stack region.

2. The semiconductor device of claim 1, wherein the redistribution pattern includes:

a pad portion on the pad region; and a line portion on the stack region, wherein a thickness in the vertical direction of the pad portion is greater than a thickness in the vertical direction of the line portion.

3. The semiconductor device of claim 2, wherein the redistribution dielectric layer has a uniform thickness, from a bottom-most surface to a top-most surface, on the stack region and the pad region.

4. The semiconductor device of claim 1, wherein a maximum thickness of the redistribution dielectric layer is greater on the pad region than on the stack region.

5. The semiconductor device of claim 4, wherein the redistribution pattern includes:

a pad portion on the pad region; and a line portion on the stack region, wherein a thickness of the pad portion is the same as a thickness of the line portion.

6. The semiconductor device of claim 1, wherein an interval between the uppermost conductive pattern and the redistribution pattern is less on the stack region than on the pad region.

7. The semiconductor device of claim 1, wherein the redistribution dielectric layer has a substantially uniform thickness on the stack region and the pad region, and the redistribution pattern is locally formed on only the pad region.

8. The semiconductor device of claim 1, wherein a thickness of the redistribution pattern is greater than a thickness of the uppermost conductive pattern.

9. The semiconductor device of claim 1, wherein the redistribution layer further includes a passivation layer on the redistribution dielectric layer and covering the redistribution pattern, wherein the passivation layer has an opening that exposes a portion of the redistribution pattern on the pad region.

10. The semiconductor device of claim 1, wherein the cell array structure includes:

a stack structure including a plurality of electrodes that are vertically stacked on the stack region;

a plurality of vertical structures that penetrate the stack structure;

a plurality of bit lines that run across the stack structure and are connected to the vertical structures; and a contact plug spaced apart from the stack structure and on the pad region, the contact plug connecting the uppermost conductive pattern to the peripheral circuit structure.

11. The semiconductor device of claim 1, further comprising:

a package substrate that includes a bonding pad on a top surface of the package substrate.

12. A semiconductor package, comprising:

a package substrate that includes a bonding pad at a top surface of the package substrate; and a plurality of semiconductor chips stacked on the package substrate, each of the semiconductor chips including a stack region on which the semiconductor chip has a first thickness and a pad region on which the semiconductor chip has a second thickness greater than the first thickness, wherein the pad regions of the semiconductor chips are vertically and horizontally spaced apart from each other.

13. The semiconductor package of claim 12, wherein each of the semiconductor chips includes a redistribution layer on top of the semiconductor chip, wherein the redistribution layer includes:

a redistribution dielectric layer; and a redistribution pattern on the redistribution dielectric layer, wherein a thickness of the redistribution layer on the pad region is greater than a thickness of the redistribution layer on the stack region.

14. The semiconductor package of claim 13, wherein for each semiconductor chip, the redistribution layer further includes a passivation layer on the redistribution dielectric layer and covering the redistribution pattern, the passivation layer having an opening that exposes a portion of the redistribution pattern on the pad region.

15. The semiconductor package of claim 14, further comprising, for each semiconductor chip, a bonding wire that connects a portion of the redistribution pattern to the bonding pad, the portion of the redistribution pattern being exposed by the opening.

16. The semiconductor package of claim 13, wherein for each semiconductor chip:

the redistribution dielectric layer has a substantially uniform thickness on the stack region and the pad region, and a thickness of the redistribution pattern on the pad region is greater than a thickness of the redistribution pattern on the stack region.

17. The semiconductor package of claim 13, wherein for each semiconductor chip:

a thickness of the redistribution dielectric layer on the pad region is greater than a thickness of the redistribution dielectric layer on the stack region, and the redistribution pattern has a substantially uniform thickness on the stack region and the pad region.

18. The semiconductor package of claim 12, wherein a difference between the first thickness and the second thickness is the same as or less than the first thickness.

19. The semiconductor package of claim 12, wherein the semiconductor chips constitute a first chip stack on the package substrate and a second chip stack on the first chip stack, wherein the semiconductor package further comprises:

a plurality of lower wires that connect the first chip stack to the package substrate;

a plurality of upper wires that connect the second chip stack to the package substrate; and a plurality of connection wires through which chip pads of the semiconductor chips are connected to each other on each of the first and second chip stacks.

20. The semiconductor package of claim 12, wherein each of the semiconductor chips includes:

a semiconductor substrate;

a peripheral circuit structure that includes a plurality of peripheral circuits on the semiconductor substrate;

a cell array structure on the peripheral circuit structure; and a redistribution layer on the cell array structure, the redistribution layer including a redistribution dielectric layer and a redistribution pattern on the redistribution dielectric layer, the redistribution dielectric layer covering an uppermost conductive pattern of the cell array structure, and the redistribution pattern being connected to the uppermost conductive pattern.

\* \* \* \* \*